(12) United States Patent
Ema

(10) Patent No.: US 7,355,893 B2
(45) Date of Patent: Apr. 8, 2008

(54) SEMICONDUCTOR MEMORY DEVICE AND METHOD FOR WRITING TO SEMICONDUCTOR MEMORY DEVICE

(75) Inventor: Taiji Ema, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 70 days.

(21) Appl. No.: 11/135,560

(22) Filed: May 24, 2005

(65) Prior Publication Data

US 2006/0181926 A1 Aug. 17, 2006

(30) Foreign Application Priority Data

Feb. 15, 2005 (JP) ............................. 2005-037524

(51) Int. Cl.
*G11C 16/04* (2006.01)
(52) U.S. Cl. ........................... 365/185.28; 365/185.18; 365/185.27
(58) Field of Classification Search ........... 365/185.28, 365/185.27, 185.18
See application file for complete search history.

(56) References Cited

U.S. PATENT DOCUMENTS

| | | | | |
|---|---|---|---|---|
| 5,742,541 | A * | 4/1998 | Tanigami et al. | 365/185.3 |
| 5,828,604 | A * | 10/1998 | Kawai et al. | 365/185.22 |
| 6,898,127 | B2 * | 5/2005 | Kuo | 365/185.28 |
| 7,009,888 | B2 * | 3/2006 | Masuoka et al. | 365/185.28 |
| 7,023,740 | B1 * | 4/2006 | Wong et al. | 365/185.28 |
| 7,133,316 | B2 * | 11/2006 | Lue | 365/185.28 |
| 2002/0071314 | A1 * | 6/2002 | Sakakibara et al. | 365/185.22 |
| 2006/0181926 | A1 * | 8/2006 | Ema | 365/185.18 |

FOREIGN PATENT DOCUMENTS

| | | |
|---|---|---|
| JP | 6-62562 | 3/1994 |
| JP | 6-314495 | 11/1994 |
| JP | 11-87658 | 3/1999 |
| JP | 11-177068 | 7/1999 |
| JP | 2000-268586 | 9/2000 |
| JP | 2000-306390 | 11/2000 |
| JP | 2002-140893 | 5/2002 |
| JP | 2004-297922 | 10/2004 |
| WO | WO 02/13199 | 2/2002 |

* cited by examiner

*Primary Examiner*—Ly Duy Pham
(74) *Attorney, Agent, or Firm*—Westerman, Hattori, Daniels & Adrian, LLP.

(57) ABSTRACT

The semiconductor memory device comprising: an n-channel memory cell transistor including: a first diffused region and a second diffused region formed in a semiconductor substrate; a charge storage layer formed over the semiconductor substrate between the first diffused region and the second diffused region; and a gate electrode formed over the charge storage layer; a power supply circuit formed on the semiconductor substrate, the power supply circuit being connectable to the first diffused region, pumping a voltage supplied from an outside power supply and outputting the pumped voltage; and writing means which, upon writing to the n-channel memory cell transistor, applies a reference voltage to the second diffused region, and applies a negative voltage with respective to the reference voltage supplied from the power supply circuit to the first diffused region to thereby flow current between the first diffused region and the second diffused region and to store charges in the charge storage layer.

22 Claims, 18 Drawing Sheets

SEMICONDUCTOR MEMORY DEVICE AND METHOD FOR WRITING TO SEMICONDUCTOR MEMORY DEVICE

CROSS-REFERENCE TO RELATED APPLICATIONS

This application is based upon and claims the benefit of priority from the prior Japanese Patent Application No. 2005-037524, filed on Feb. 15, 2005, the entire contents of which are incorporated herein by reference.

BACKGROUND OF THE INVENTION

The present invention relates to a semiconductor memory device and a method for writing to the semiconductor memory device, more specifically a semiconductor memory device for memorizing information by storing charges and a method for writing to the semiconductor memory device.

As rewritable nonvolatile semiconductor memory devices are generally known EEPROM, flash EEPROMs, etc., which memorize information by storing charges in the floating gates. For programming in these semiconductor memory devices, charges are injected into the floating gates to thereby write information, and charges stored in the floating gates are extracted to thereby erase information.

The general programming method for the conventional semiconductor memory devices will be explained with reference to FIGS. 14A to 17.

FIG. 14A show one example of applied voltages upon writing. FIG. 14B shows one example of applied voltages upon erasing.

An n-well 202 is formed in p-type semiconductor substrate 200. In the n-well 202, p-well 204 is formed. In the p-well 204, a memory cell transistor including a floating gate 206 as the charge storage layer, a control gate 208 connected to a word line (WL), a source diffused region 210 connected to a source line (SL) and a drain diffused region 212 connected to a bit line (BL) is formed.

When memory information is written to the memory cell transistor, as shown in FIG. 14A, 5 V is applied to the drain diffused region 212 via the bit line (BL), 10 V is applied to the control gate 208 via the word line (WL), the source diffused region 210 is grounded via the source line (SL), and the p-well is grounded. Thus, a current flows between the source diffused region 210 and the drain diffused region 212 to thereby generate hot electrons, and a part of the hot electrons are injected into the floating gate 206. Negative charges (electrons) are injected into the floating gate 206, whereby the threshold voltage Vt of the memory cell transistor becomes high. This state is called program-state.

When information memorized in the memory cell transistor is erased, as shown in FIG. 4B, −10 V is applied to the word line WL and 10 V to the n-well 202 and the p-well 204, and the source diffused region 210 and the drain diffused region 212 are floating. Thus, a high voltage is applied to the tunnel insulating film formed between the floating gate 206 and the p-well 204, whereby electrons stored in the floating gate 206 are extracted to the p-well 204 due to the tunneling phenomenon. When electrons stored in the floating gate 206 are extracted, the threshold voltage Vt of the memory cell transistor becomes low. This state is called erase-state.

FIG. 15 shows one example of applied voltages upon reading information.

When information memorized in the memory cells is read, a voltage of, e.g., 5 V is applied to the word line (WL1) connected to the memory cell transistor MC to be read (selected), voltages of the word lines (WL0, WL2, WL3, . . . ) other than the selected word line (WL1) are, e.g., 0 V (un-selected). A voltage of, e.g., 0.5 V is applied to the bit line (BL1) connected to the memory cell transistor MC to be read (selected), and the other bit lines (BL0, BL2, BL3, . . . ) are floating (un-selected). The source line (SL) connected to the source diffused region 210 of the respective memory cell transistors, and the p-well 204 is grounded. Corresponding to a current flowing in the bit line (BL1) connected to the memory cell transistor MC to be read, when the current is higher than a reference value, the memory cell transistor is judged to be in the erase-state, and when the current is lower, the memory cell transistor MC is judged to be in the program-state.

Accordingly, a memory cell in the program-state is required only to flow no current irrespective of selected or un-selected. On the other hand, a memory cell in the erase-state must flow a large current to be judged as erase-state when selected (WL=5 V). However, if the memory cell in the erase-state flows a current even when un-selected (WL=0 V), the current flows in the selected bit line through the un-selected cells although the selected memory cell is in the program-state and information cannot be correctly read. In order to prevent this, it is necessary that no current should flow when the cell is un-selected (WL=0 V).

FIG. 16 schematically shows the distribution of the threshold voltage Vt of memory cell transistors. As described above, in the program-state the memory cells are required to flow no current irrespective of selected or un-selected and may have threshold voltages larger than a certain value (VT3 in FIG. 16). On the other hand, in the erase-state the memory cells must satisfy two restrictions that the memory cells flow a large current when selected and must flow no current when un-selected. The threshold voltage must be not more than a certain value (VT2) and not less than a certain value (VT1).

Generally, the writing and erasing characteristics of the memory cells cannot be prevented from fluctuations, and as shown in FIG. 16, the threshold voltages Vt of the program-state and the erase-state have fluctuations in the memory cell array. Especially the fluctuations of the erase-state are larger than the fluctuations of the program-state, and after the erase by the tunnel current, some memory cells have threshold voltages of less than VT1. Such cells having threshold voltages of less than VT1 are called over erase cells, and a programming, which is called write-back, to increase the threshold voltage after the erase is required.

In the write-back programming after the erase, 0 voltage, for example, is applied to the word lines (WL), 5 V is applied to the bit lines (BL), and the source line (SL) and the p-well 104 are grounded, whereby light writing is performed. This write-back programming is called a self-convergent programming. The write-back programming after the erase is detailed in, e.g., Reference 1 (Japanese published unexamined patent application No. 2000-268586) and Reference 2 (Japanese published unexamined patent application No. 2000-306390).

FIG. 17 shows one example of the applied voltages in the write-back operation.

In the write-back programming, 5 V, for example, is applied to a selected bit Line (BL1), and the other bit lines (BL0, BL2, BL3, . . . ) are floating. All the word lines (WL0, WL1, WL2, WL3, . . . ), the source line (SL) connected to the source diffused region 210 of the respective memory cell transistors, and the p-well 204 thereof are grounded. Thus, the writing is made in cells connected to the selected bit line (BL) and having low threshold voltages Vt at which currents flow even with 0 V applied to the word lines. The write-back programming is executed for each bit line.

As described above, as a voltage used in writing in the memory cell transistors, a high voltage of 5 V, which is higher than the voltage of the power supply, is required. To this end, a pumping circuit for generating such high voltage is provided in a chip, and the high voltage generated by the pumping circuit is used in the programming for the memory cell transistors. The pumping circuit is described in, e.g., Reference 3 (Japanese published unexamined patent application No. Hei 06-062562) and Reference 4 (Japanese published unexamined patent application No. 2004-297922).

SUMMARY OF THE INVENTION

FIG. 18 schematically shows the relationship between the median of the threshold voltage Vt of the memory cell transistors forming the memory cell array, and the current flowing in the bit lines with all the word lines grounded.

As the median of the threshold voltages Vt of the memory cell transistors is smaller, a larger number of the cells have lower threshold voltages Vt, and the sub-threshold currents of the memory cell transistors increase. Thus, even with all the word lines grounded, the currents flowing in the bit lines exponentially increase. Furthermore, when a high voltage of 5 V upon the writing is applied to the bit lines, punch-through currents flows in addition to the above-described sub-threshold currents, and currents flowing in the bit lines abruptly increase.

The high voltage to be applied upon the writing is generated by the internal pumping circuit, and the current-supplying capacity of the internal pumping circuit is limited by the size of the pumping capacitor of the pumping circuit, etc. If the current-supplying capacity of the pumping circuit is below a current following through the bit line, a voltage to be applied to the bit line upon the writing is dropped, and when the drop is large, the writing cannot be made. The problem of such the voltage decrease can be prevented by increasing the current-supplying capacity of the pumping circuit, and in such case, the pumping capacitor must be increased. This increases the chip area, and the electric power consumption for the writing is increased too.

Since the write-back programming is executed for each bit line which including over erase cells, leakage current of the bit line is usually large and serious. In the ordinary programming, although no over erase cell is present, the voltage applied to a selected word line is large, which makes the current flowing in the selected cell large, and the balance with the current-supplying capacity of the pumping circuit is an important problem too.

An object of the present invention is to provide a structure of a semiconductor memory device which can decrease the leakage current flowing in the bit lines upon the writing while suppressing increases of the chip area, and a method for writing to the semiconductor memory device.

According to one aspect of the present invention, there is provided a semiconductor memory device comprising: an n-channel memory cell transistor including: a first diffused region and a second diffused region formed in a semiconductor substrate; a charge storage layer formed over the semiconductor substrate between the first diffused region and the second diffused region; and a gate electrode formed over the charge storage layer; a power supply circuit formed on the semiconductor substrate, the power supply circuit being connectable to the first diffused region, pumping a voltage supplied from an outside power supply and outputting the pumped voltage; and writing means which, upon writing to the n-channel memory cell transistor, applies a reference voltage to the second diffused region, and applies a negative voltage with respective to the reference voltage supplied from the power supply circuit to the first diffused region to thereby flow current between the first diffused region and the second diffused region and to store charges in the charge storage layer.

According to another aspect of the present invention, there is provided a method for writing to a semiconductor memory device comprising an n-channel memory cell transistor including a first diffused region and a second diffused region formed in a semiconductor substrate, a charge storage layer formed over the semiconductor substrate between the first diffused region and the second diffused region, and a gate electrode formed over the charge storage layer; and a power supply circuit formed on the semiconductor substrate, the power supply circuit being connectable to the first diffused region, pumping a voltage supplied from an outside power supply and outputting the pumped voltage, comprising: applying a reference voltage to the second diffused region, supplying a negative voltage with respective to the reference voltage from the power supply circuit, and applying the negative voltage to the first diffused region, whereby current is flowed between the first diffused region and the second diffused region, and charges are stored in the charge storage layer.

According to the present invention, the write-back programming is executed by connecting the internal pumping circuit supplying a negative voltage to the side of the source line of the n-channel memory cell transistors and applying the prescribed voltages to the other terminals with reference to the voltage of the source terminal as the reference voltage, whereby even when the currents flowing in the bit lines are large, and the source potential is increased, the leakage current can be automatically suppressed by the source potential increase, and the excessive increase of the source potential upon the programming can be suppressed. Thus, the leakage currents flowing in the bit lines upon the programming can be decreased, and the area of the pumping capacitor of the internal pumping circuit can be made small. Accordingly, the chip area of the semiconductor memory device can be reduced, and the electric power consumption for executing the programming can be decreased.

DETAILED DESCRIPTION OF THE PREFERRED EMBODIMENTS

A First Embodiment

The semiconductor memory device and method for writing to the semiconductor memory device according to a first embodiment of the present invention will be explained with reference to FIGS. 1 to 5.

Figure 1:
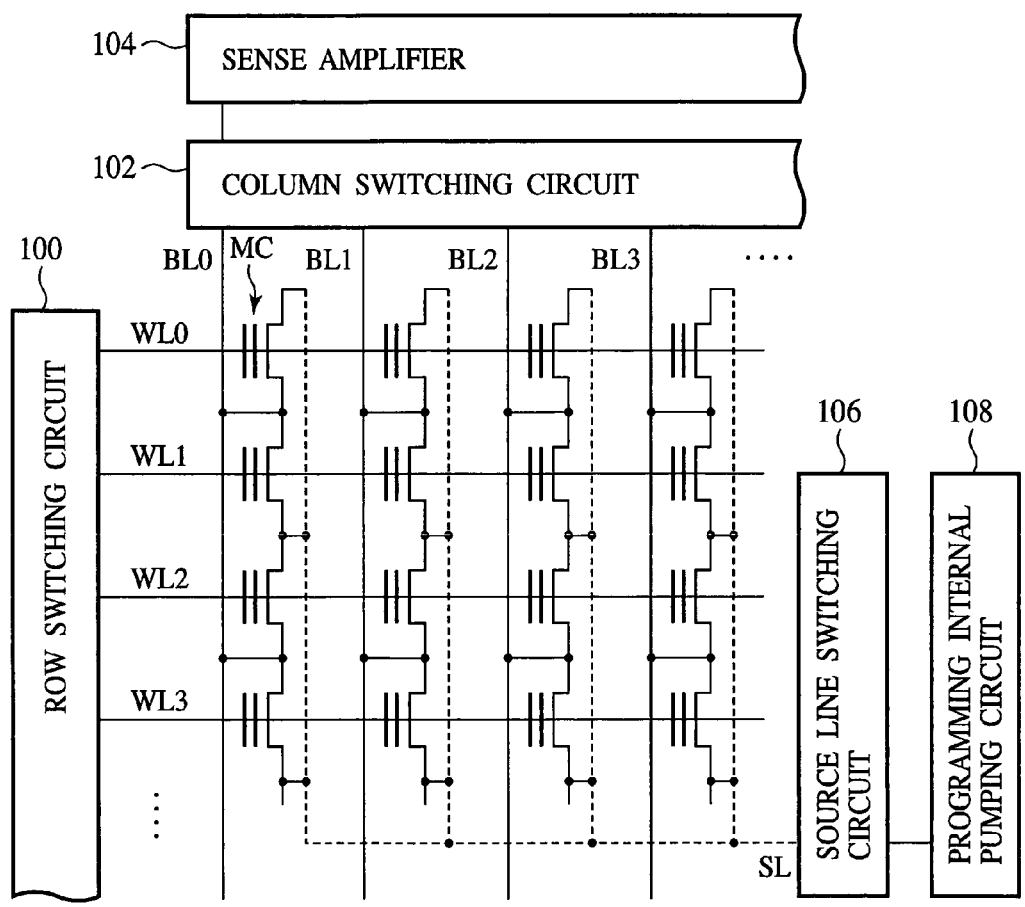
FIG. 1 is a circuit diagram of the semiconductor memory device according to a first embodiment of the present invention, which shows a structure thereof.
Figure 2:
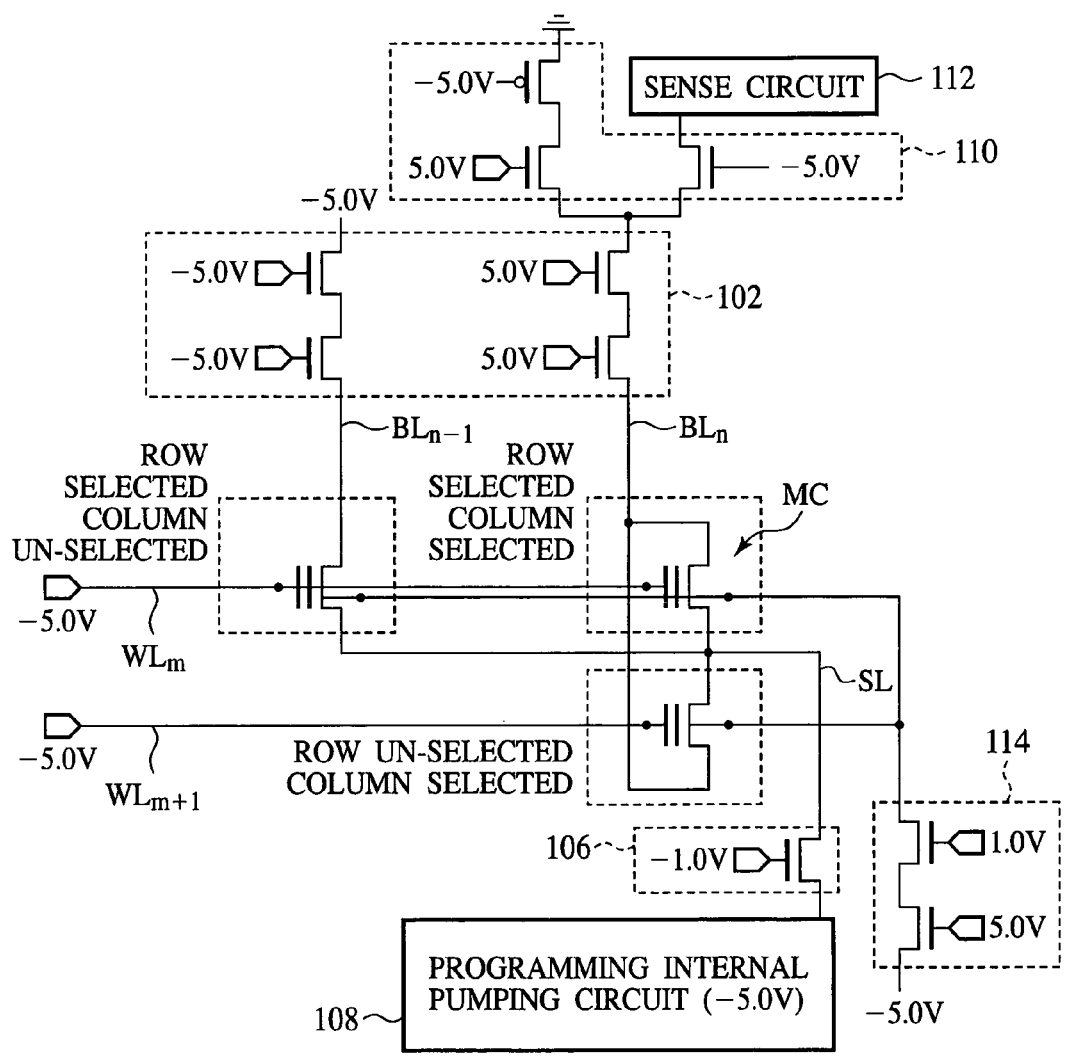
FIG. 2 is a circuit diagram showing a method for writing to the semiconductor memory device according to the first embodiment of the present invention.
Figure 3:
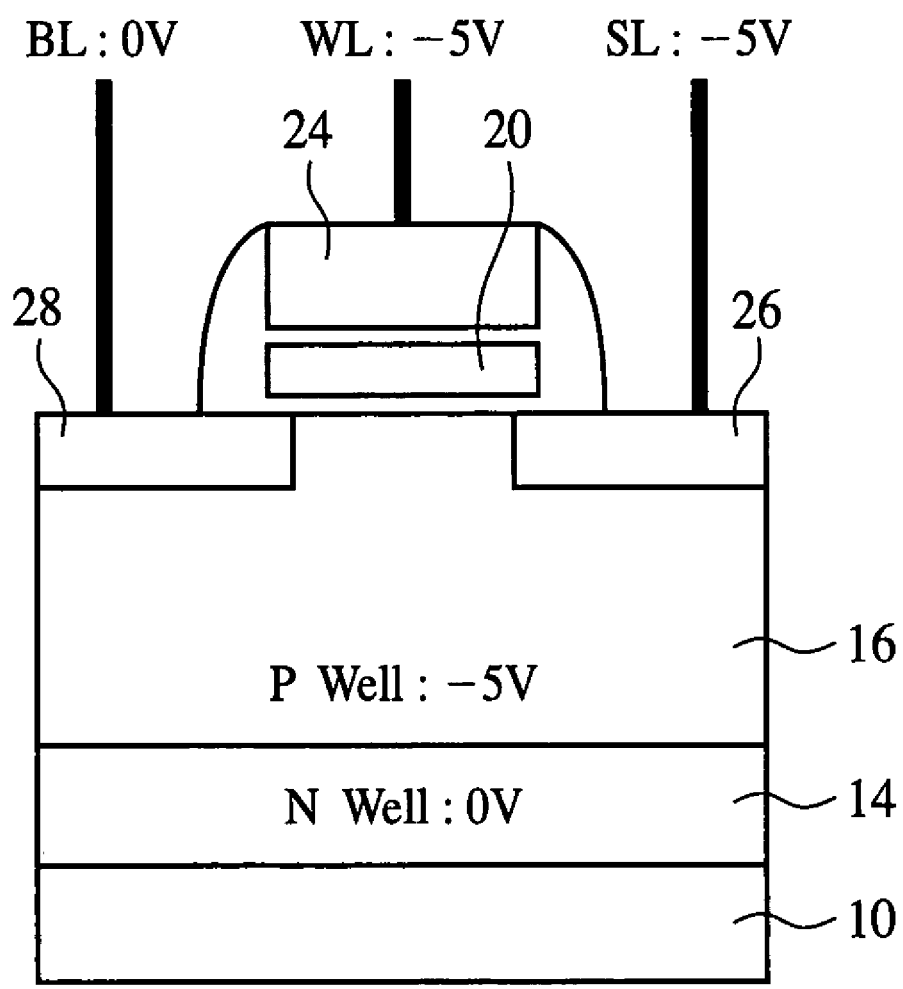
FIG. 3 is a view showing voltages applied to the respective terminals of the memory cell transistor for the write-back programming of the semiconductor memory device according to the first embodiment of the present invention.
Figure 4:
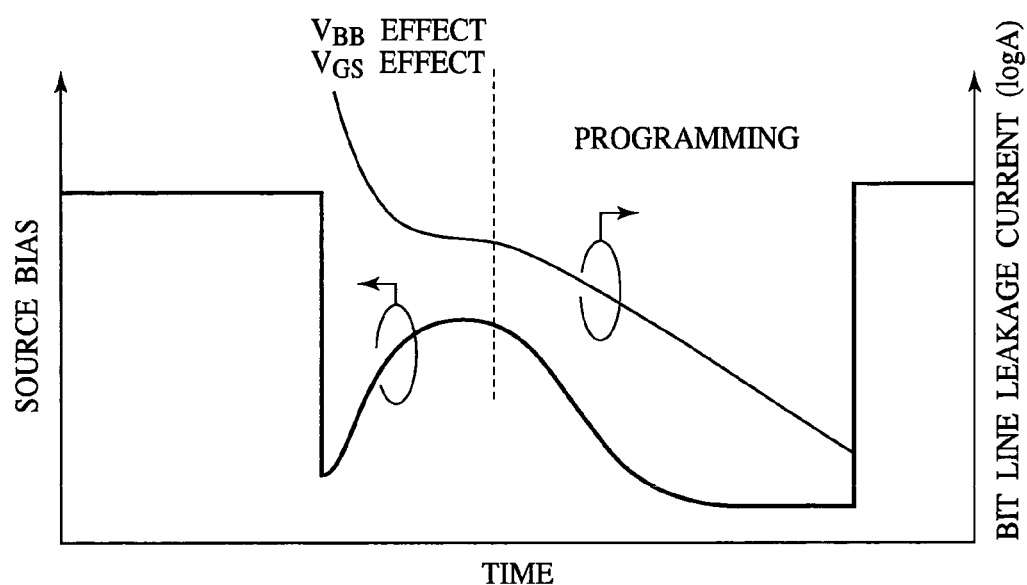
FIG. 4 is a graph showing the transient change of the source potential and the bit line current upon executing the write-back programming.
Figure 5:
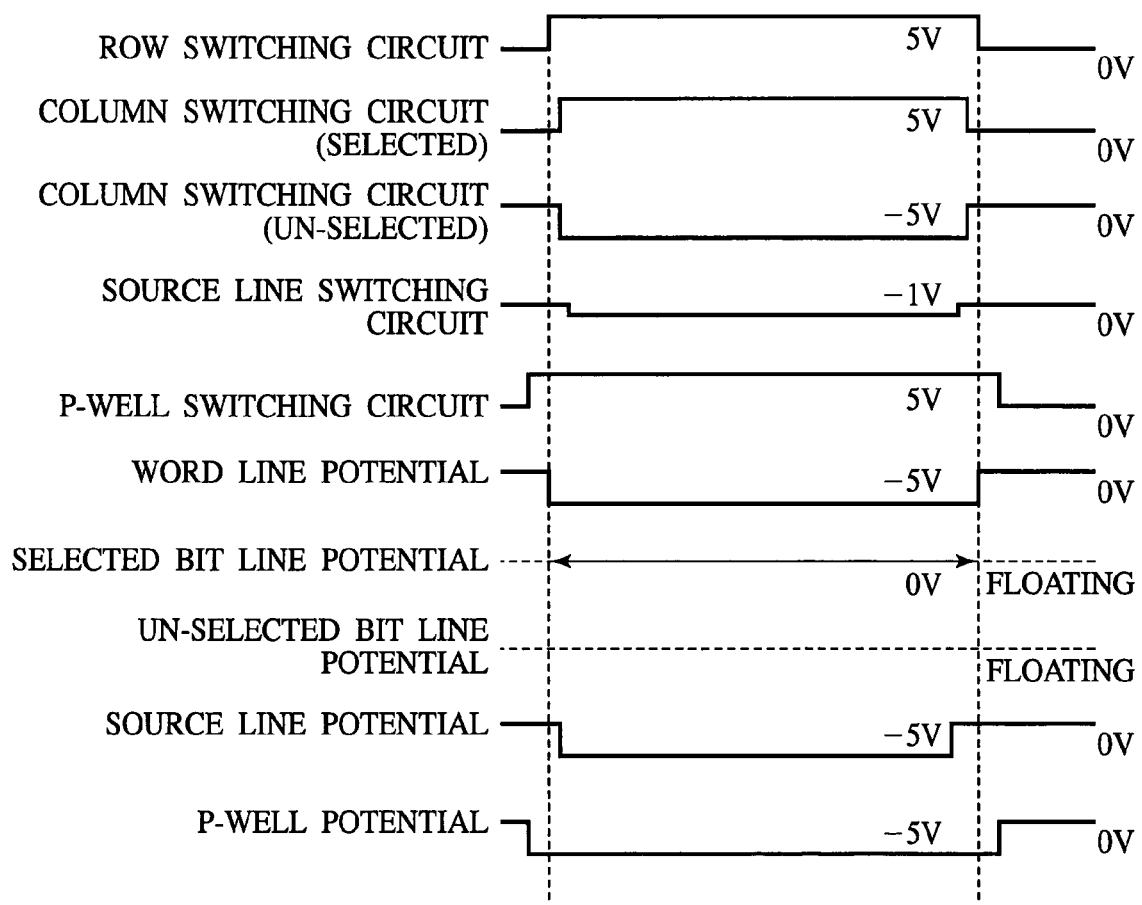
FIG. 5 is a time chart showing the method for writing to the semiconductor memory device according to the first embodiment of the present invention.

FIG. 1 is a circuit diagram of the semiconductor memory device according to the present embodiment, which shows a structure thereof. FIG. 2 is a circuit diagram showing a method for writing to the semiconductor memory device according to the present embodiment. FIG. 3 is a view showing voltages applied to the respective terminals of the memory cell transistor for the write-back programming of the semiconductor memory device according to the present embodiment. FIG. 4 is a graph showing the transient change of the source potential and the bit line current upon executing the write-back programming. FIG. 5 is a time chart showing the method for writing to the semiconductor memory device according to the present embodiment.

First, the structure of the semiconductor memory device according to the present embodiment will be explained with reference to FIG. 1.

As shown in FIG. 1, memory cell transistors MC are arranged in a matrix in the row-wise (horizontally as viewed in the drawing) and column-wise (vertically as viewed in the drawing), and a memory cell array is formed.

Word lines WL (WL0, WL1, WL2, WL3, . . . ) extended in row-wise are provided for the respective rows of the memory cell array. The gate terminals of the memory cell transistors MC arranged in row-wise are commonly connected to the associated word lines WL.

Bit lines BL (BL0, BL1, BL2, BL3, . . . ) extended in column-wise are provided for the respective columns of the memory cell array. One terminals of the source/drain terminals (e.g., the drain terminals) of the memory cell transistors MC arranged in column-wise are commonly connected to the associated bit lines BL. The other terminals of the source/drain terminals (e.g., the source terminals) of the memory cell transistors MC are commonly connected to the source line SL.

The word lines WL are connected to a row switching circuit 100 to thereby apply prescribed drive voltages to arbitrary word lines WL. The bit lines BL are connected to a column switching circuit 102 to thereby apply prescribed drive voltages to arbitrary bit lines BL. The column switching circuit 102 is connected to a sense amplifier 104. The source line SL is connected via a source line switching circuit 106 to a programming internal pumping circuit 108 for increasing the power supply voltage. The programming internal pumping circuit 108 includes a charge-pump circuit which is a power supply circuit incorporated in the chip and generates high voltages necessary for the programming.

Although not shown, the memory cell transistors MC are formed in a p-well formed in an n-well formed in a p-type semiconductor substrate. The n-well and the p-well are connected to outside via switching circuits to supply required voltages in accordance with operations.

Next, the method for writing to the semiconductor memory device according to the present embodiment will be explained with reference to FIGS. 2 to 5.

FIG. 2 shows a detailed circuit diagram and the applied voltages for executing the write-back programming.

As shown in FIG. 2, a selected bit line (the bit line $BL_n$ in the drawing) is connected to a reference voltage via the column switching circuit 102 and a programming/reading conversion switch 110. The programming/reading conversion switch 110 applies prescribed voltages to the bit lines in the programming and connects the bit line BL to a sense circuit 112 in the reading. The reference voltage is a voltage to be referred to in the operation and is usually the ground voltage.

A voltage of, e.g., −5 V is applied to a un-selected bit lines (the bit line $BL_{n-1}$ in the drawing) via the column switching circuit 102 and the programming/reading conversion switch (not shown). A drive voltage of, e.g., −5 V is applied to the switching transistor of the un-selected bit line (the bit line $BL_{n-1}$), and the un-selected bit line is floating.

A voltage of, e.g., −5 V supplied from the programming internal pumping circuit 108 is applied to the source line SL via the source line switching circuit 106.

A voltage of, e.g., −5 V is applied to both a selected word line (the word line $WL_m$) and a un-selected word lines (the word line $WL_{m+1}$) via the row switching circuit (not shown). The power supply connected to the word lines WL is different from the programming internal pumping circuit 108 connected to the source line SL.

A voltage of, e.g., −5 V is applied, via the p-well switching circuit 114, to the p-well where the memory cell transistors MC are formed. The power supply connected to the p-well is different from the programming internal pumping circuit 108 connected to the source line SL.

The switching circuits, such as the column switching circuit 102, the p-well switching circuit 114, etc., to which high voltages are applied to have the cascode structure, in which the transistors are serially connected in 2 stages.

In FIG. 3, a selected transistor MC alone is extracted to show the voltages applied to the terminals of the memory cell transistor MC in the write-back programming.

As shown in FIG. 3, in the write-back programming, the n-well 14 is connected to the reference voltage, a voltage of −5 V is applied to the p-well 16, the drain diffused region 28 is connected to the reference voltage via the bit line BL, a voltage of −5 V is applied to the control gate 24 via the word line WL, and a voltage of −5 V supplied from the programming internal pumping circuit 108 is applied to the source diffused region 26 via the source line SL.

As described above, in the method for writing to the semiconductor memory device according to the present embodiment, a voltage of −5 V supplied from the programming internal pumping circuit 108 is connected to the source line SL, potential differences necessary for the program are applied to the respective terminals with the voltage of the source line SL as the standard. The negative voltage to be applied to the source line SL is set so that the bit lines BL are at the reference voltage. The memory cell transistors MC are formed in the p-well in the n-well (double well) formed in the p-type semiconductor substrate 10 and are electrically isolated from the p-well where the peripheral logic circuit, etc. are formed. The application of a negative −5 V voltage causes accordingly no trouble.

FIG. 4 is a graph showing the transient change of the source potential and the bit line current in the write-back programming with the current-supplying capacity of the programming internal pumping circuit 108 being smaller than the current flowing in the bit lines BL.

When the current-supplying capacity of the programming internal pumping circuit 108 is larger than the current flowing in the bit lines BL, a 5 V potential difference is applied as it is between the sources and the drains of the memory cell transistors, and the self-convergent programming can be executed without trouble.

When the current-supplying capacity of the programming internal pumping circuit 108 is smaller than the current flowing in the bit lines BL, the output voltage of the programming internal pumping circuit 108 has the absolute values lowered. The voltage to be applied to the source line SL is accordingly increased.

However, when the voltage applied to the source line SL is increased, the source potentials of the memory cell transistors MC rise to generate potential differences with respect to the p-well, and the threshold voltages Vt of the memory cell transistors MC are raised by the back bias effect ($V_{BB}$ effect). Also between the control gates and sources, potential differences are generated in the direction of turning off the transistors ($V_{GS}$ effect). Both these effects decrease the current flowing in the bit lines BL (the stage on the left side of the dotted line in FIG. 4).

Resultantly, current balancing between the capacity of the programming internal pumping circuit 108 and current flow through the bit lines BL is automatically occurred, and the potential increase of the source line SL is automatically suppressed. As described before, the current flowing in the bit lines BL exponentially depends on the threshold voltage Vt of the memory cell transistors, whereby the increase of the source line SL potential can be suppressed in, e.g., about 0.5 V, which is very small enough to keep the self-convergent programming speed in a practical range.

Once the programming is started, the current flowing in the bit lines BL is rapidly decreased by the increases of the threshold voltages Vt to be in the range of the capacity of the programming internal pumping circuit 108, and the writing can be made without trouble (the stage on the right of the dotted line in FIG. 4).

In the conventional technique, the voltage supplied from the programming internal pumping circuit is applied to the drain terminals, and the mechanisms of the back bias effect, etc. suppressing the leakage currents described above do not work. Accordingly, when the current-supplying capacity of the programming internal pumping circuit is smaller than the current flowing in the bit lines, the voltages to be applied to the drains are decreased, and when the decreases are large, the writing cannot be made.

When the normal programming, which is not the write-back programming, is executed, in the above-described writing method, a voltage of 5 V, for example, is applied to selected word line WL in place of applying a −5 V voltage to the word lines WL.

Figure 15:
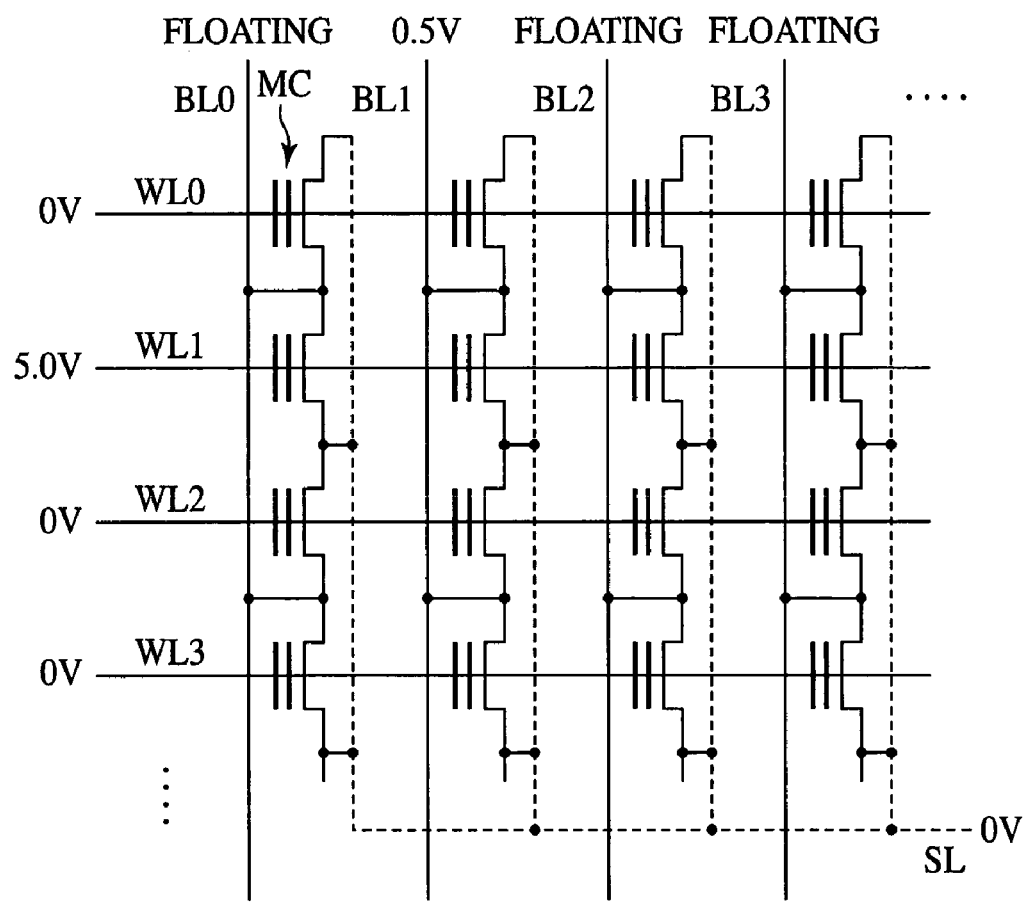
FIG. 15 is a circuit diagram showing the method for reading the conventional semiconductor memory device.
Figure 16:
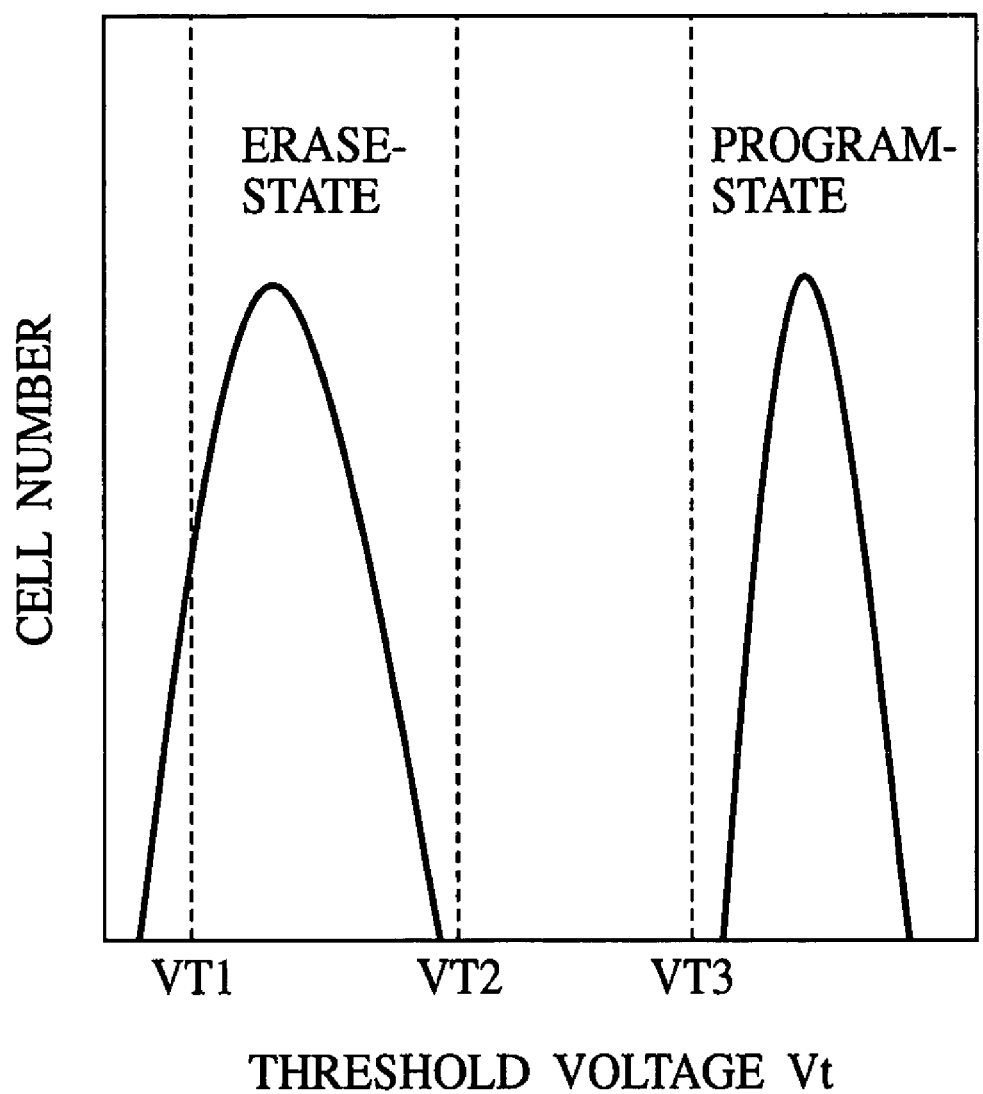
FIG. 16 is a graph showing the distribution of the threshold voltages of the memory cell transistors in the erase-state and the program-state.
Figure 17:
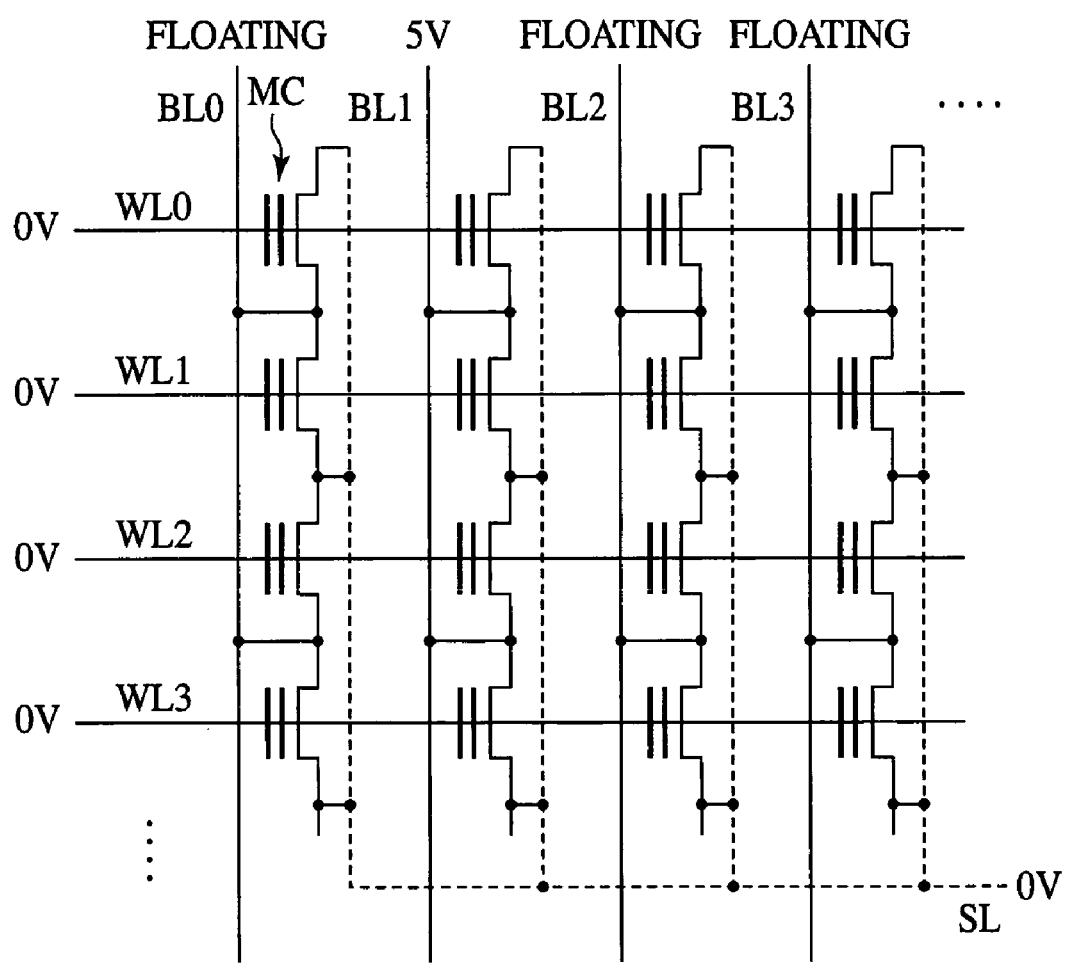
FIG. 17 is a circuit diagram showing the method for write-back programming of the conventional semiconductor memory device.
Figure 18:
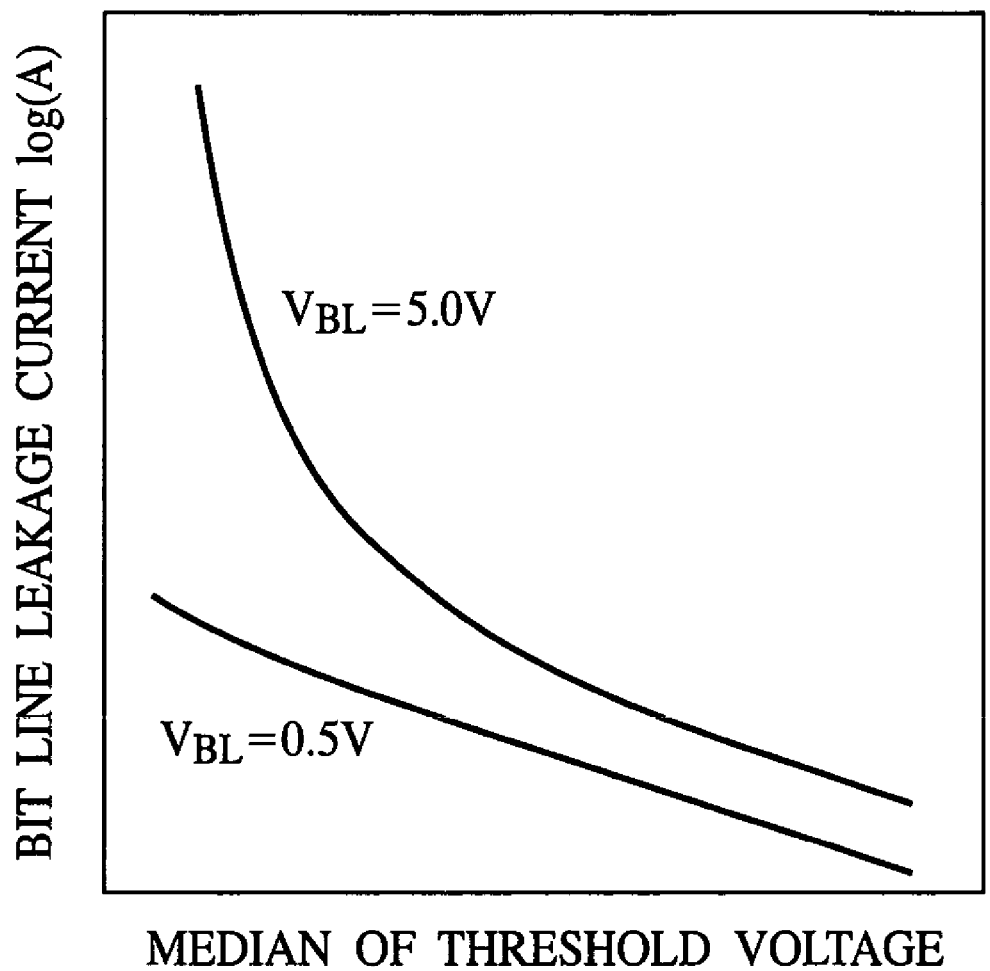
FIG. 18 is a graph showing the relationships between the leakage current flowing in the bit lines and the threshold voltage of the memory cell transistors.

When information memorized in the memory cell transistors is read, the bit lines BL and the sense circuit 112 are connected to each other by the programming/reading conversion switch 110, while a voltage of, e.g., 0.5 V is applied to a selected bit line BL, the un-selected bit lines BL is floating, a voltage of, e.g., 5 V is applied to the selected word line, and un-selected word lines WL, the source line SL and the p-well 104 are connected to, e.g., the reference voltage (see FIG. 15).

Next, the specific procedure of executing the write-back programming will be explained with reference to FIGS. 2 and 5.

First, prescribed voltages (e.g., 1 V and 5 V) are applied to the switching transistors of the p-well switching circuit 114 to turn on the p-well switching circuit 114, and a voltage of, e.g., −5 V is applied to the p-well via the p-well switching circuit 114.

Next, a prescribed voltage (e.g., 5 V) is applied to the switching transistors of the row switching circuit 100 to turn on the row switching circuit 100, and a voltage of, e.g., −5 V is applied to the word lines (word lines $WL_m$, $WL_{m+1}$) via the row switching circuit 100.

Next, a prescribed drive voltage is applied to the switching transistors of the column switching circuit 102 to apply prescribed voltages to a selected bit line (bit line $BL_n$) and un-selected bit lines (bit line $BL_{n-1}$). A voltage of, e.g., 5 V is applied to the switching transistors for the selected bit line to turn on the transistors and connect the bit line to the reference voltage. On the other hand, a voltage of, e.g., −5 V is applied to the switching transistors of the un-selected bit lines to kept the switching transistors in off state and keep the bit lines floating.

Then, a prescribed drive voltage (e.g., −1 V) is applied to the switching transistor of the source line switching circuit 106 to turn on the source switching circuit 106 and to apply to the source line SL a voltage of −5 V supplied from the programming internal pumping circuit 108. The voltage to be applied to the source line SL is applied after the voltage has been applied to the p-well. Thus, the application of a forward bias to the source junctions can be prevented.

After the prescribed write-back programming has been executed, the source line switching circuit 106, the column switching circuit 102, the row switching circuit 100, and the p-well switching circuit 114 are sequentially turned off to end the write-back programming for the selected bit line.

As described above, according to the present embodiment, the internal pumping circuit, which supplies a negative voltage to the source line side of the n-channel memory cell transistors, and prescribed voltages are applied to the other terminals with the voltage of the source line SL as the standard to execute the write-back programming, whereby the excessive increase of the potential of sources upon the writing can be prevented. Thus, the leakage current flowing in the bit lines can be decreased, and the area of the pumping capacitor of the internal pumping circuit can be small. Thus, the chip area of the semiconductor memory device can be reduced, and the electric power consumption for the programming can be decreased.

A Second Embodiment

The semiconductor memory device and the method for writing to the semiconductor memory device according to the second embodiment of the present invention will be explained with reference to FIG. 6. The same members of the present embodiment as those of the semiconductor memory device and the method for writing to the semiconductor memory device according to the first embodiment shown in FIGS. 1 to 5 are represented by the same reference numbers not to repeat or to simplify their explanation.

Figure 6:
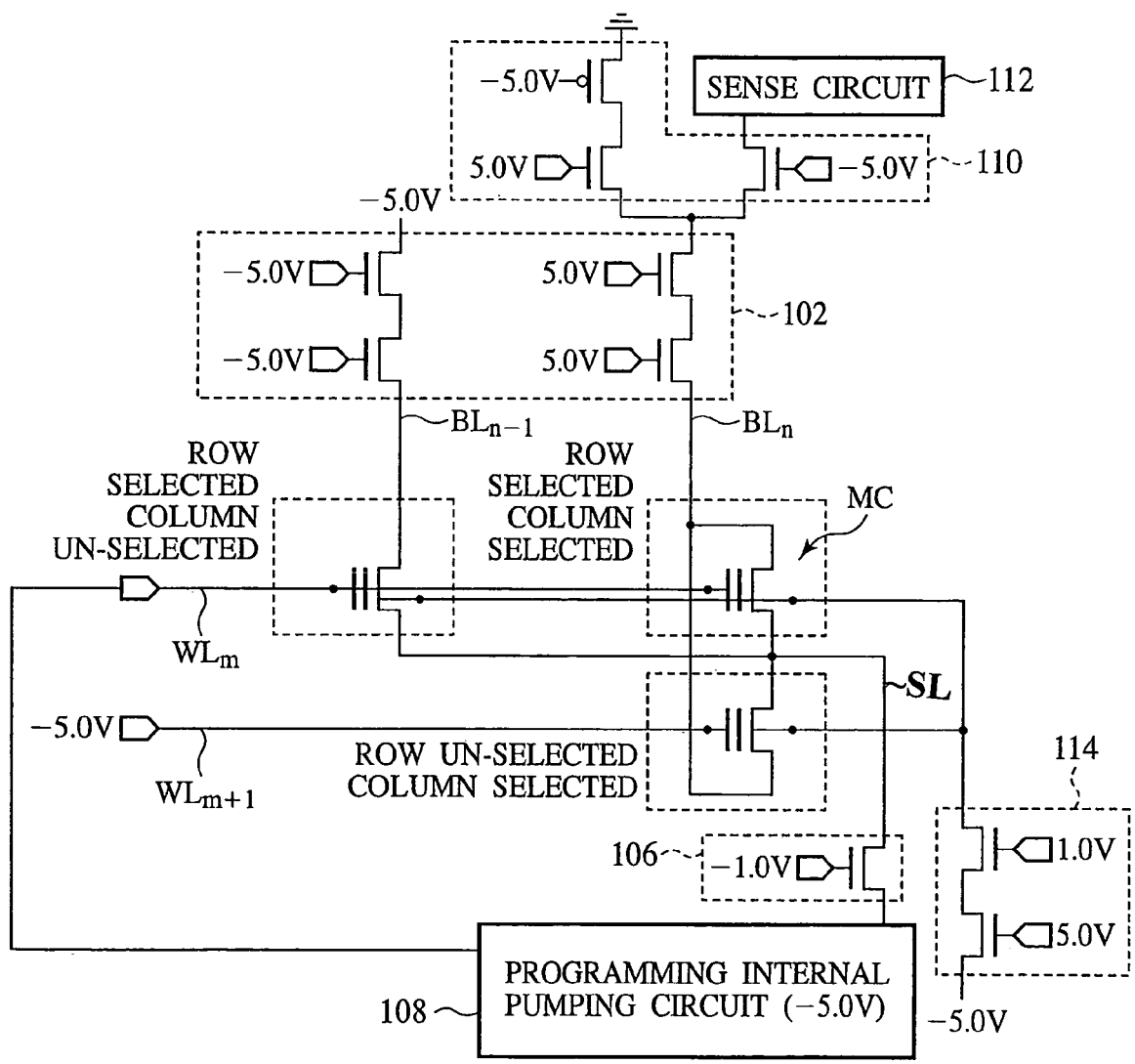
FIG. 6 is a circuit diagram showing a method for writing to the semiconductor memory device according to a second embodiment of the present invention.

FIG. 6 is a circuit diagram showing a structure of the semiconductor memory device and the method for writing to the semiconductor memory device according to the present embodiment.

The semiconductor memory device according to the present embodiment is characterized mainly in that, as shown in FIG. 6, an output voltage from the programming internal pumping circuit 108 is applied not only the source line SL, but also to the selected word line (word line WLm) via the row switching circuit (not shown). The rest structure is the same as that of the semiconductor memory device according to the first embodiment.

In the method for writing to the semiconductor memory device according to the first embodiment, the power supply connected to the word lines WL is different from the programming internal pumping circuit 108. Accordingly, when the potential of the source line SL is increased due to the lack of the current-supplying capacity of the programming internal pumping circuit 108, potential differences are generated between the control gates and the sources in the direction of turning off the transistors, whereby the currents flowing in the bit lines BL are suppressed.

However, in the method for writing to the semiconductor memory device according to the present embodiment, the power supply to be connected to the word lines WL is the programming internal pumping circuit 108 to be connected to the source line SL, whereby even when the potential of the source line SL is increased due to the lack of the current-supplying capacity of the programming internal pumping circuit 108, no potential difference takes place between the control gates and the sources. Thus, in the method for writing to the semiconductor memory device according to the present embodiment, the effect of decreasing the bit line leakage current due to the above-described $V_{GS}$ effect cannot be used.

However, in the method for writing to the semiconductor memory device according to the present embodiment, the current flowing between the source and the drain is larger than in the method for writing to the semiconductor memory device according to the first embodiment, whereby the programming speed can be increased.

Accordingly, in a case that the current-supplying capacity of the programming internal pumping circuit 18 can be covered by the back bias effect alone, the semiconductor memory device and the method for writing to the semiconductor memory device according to the present embodiment are especially effective.

As described above, according to the present embodiment, the write-back programming is executed by connecting the internal pumping circuit which supplies a negative voltage to the source line side of the n-channel memory cell transistors and applying prescribed voltages to the other terminals with the voltage of the source line SL as the standard, whereby the increase of the potentials of the sources upon the programming can be suppressed. This makes it possible to decrease the leakage current flowing in the bit lines, and to reduce the area of the pumping capacitor of the internal pumping circuit small. Thus, the chip area of the semiconductor memory device can be reduced, and the electrical power consumption for executing the programming can be decreased.

The negative voltage supplied from the internal pumping circuit is applied also to the word lines, whereby the programming speed can be increased.

A Third Embodiment

The semiconductor memory device and the method for writing to the semiconductor memory device according to a third embodiment of the present invention will be explained with reference to FIGS. 7 and 8. The same members of the present embodiment as those of the semiconductor memory device and the method for writing to the semiconductor memory device according to the first and the second embodiments shown in FIGS. 1 to 6 are represented by the same reference numbers not to repeat or to simplify their explanation.

Figure 7:
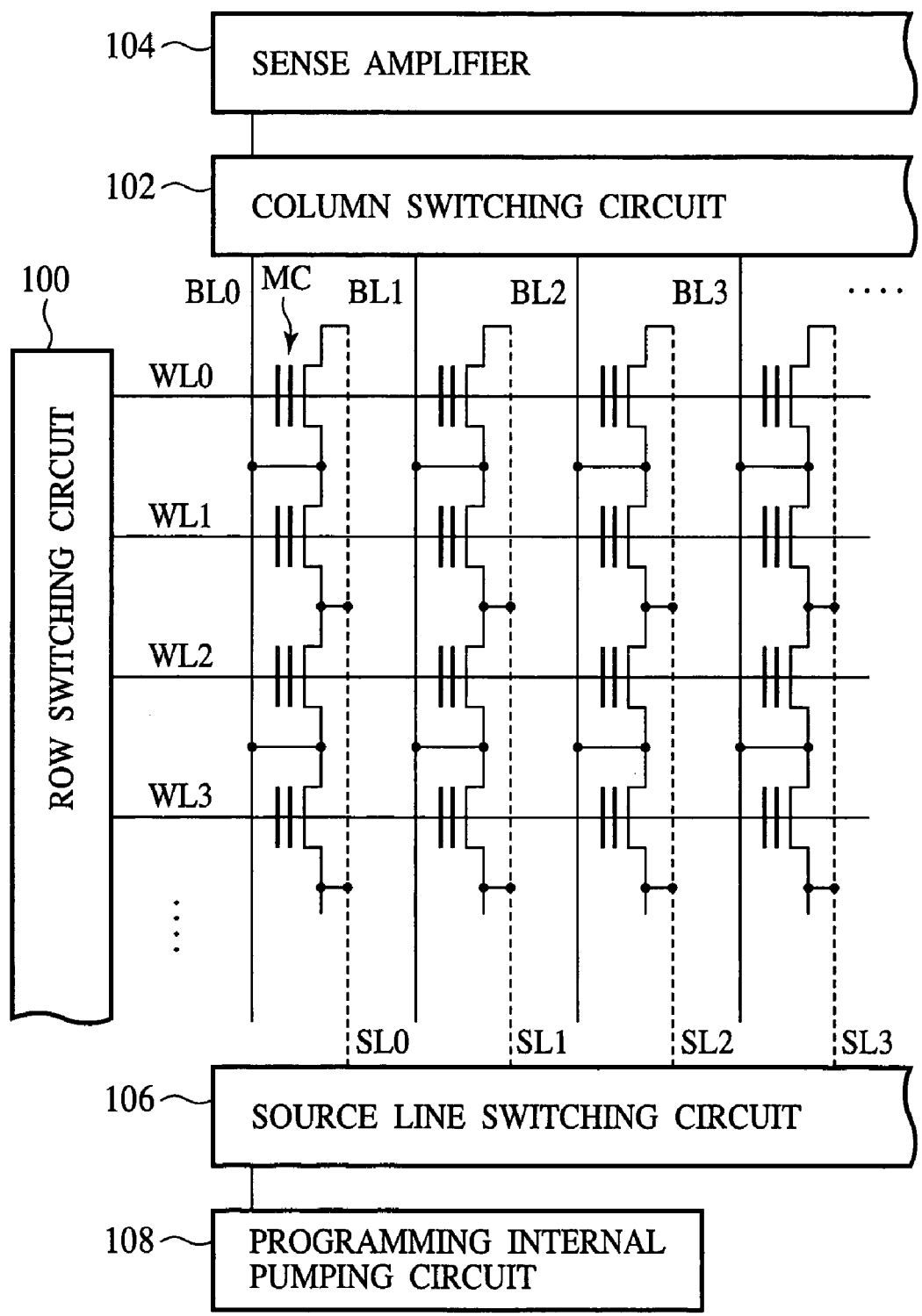
FIG. 7 is a circuit diagram of the semiconductor memory device according to a third embodiment of the present invention, which shows a structure thereof.

FIG. 7 is a circuit diagram showing a structure of the semiconductor memory device according to the present embodiment. FIG. 8 is a view showing the structure of the semiconductor memory device and the method for writing to the semiconductor memory device according to the present embodiment.

The semiconductor memory device according to the present embodiment is characterized mainly in that, as shown in FIG. 7, the source line SL is divided in source lines SL0, SL1, SL2, SL3, . . . corresponding to bit lines BL0, BL1, BL2, BL3, . . . , so that the output voltage supplied from the programming internal pumping circuit 108 can be applied to an arbitrary one of the source lines SL0, SL1, SL2, SL3, . . . by the source line switching circuit 106. The rest structure is the same as that of the semiconductor memory device according to the first embodiment.

The structure of the circuit of the semiconductor memory device according to the first embodiment is mainly for the write-back programming. When the ordinary programming is executed in the circuit shown in FIGS. 1 and 2, there is risk that the writing might be made also in the un-selected memory cell transistors.

That is, in the semiconductor memory device according to the first embodiment, in which the source line SL is common among the memory cell transistors connected the bit lines BL different from one another, a voltage is applied to the source line SL so as to write in the memory cell transistor MC connected to one of the bit lines BL, the voltage is applied also to the source line SL connected to the memory cell transistors MC connected to the others of the bit lines BL. At this time, the un-selected bit lines BL are floating, and no DC current flows there. However, the transient charge/discharge currents cannot be prevented, and some of the writing is made.

As in the semiconductor memory device according to the present embodiment, the source line SL is divided in the source liens SL0, SL1, SL2, SL3, . . . corresponding to the bit lines BL0, BL1, BL2, BL3, . . . , whereby, in the ordinary programming, the output voltage from the programming internal pumping circuit 108 can be applied only to source lines SL corresponding to selected bit lines BL. Thus, the writing in the un-selected memory cell transistors MC can be prevented.

Figure 8:
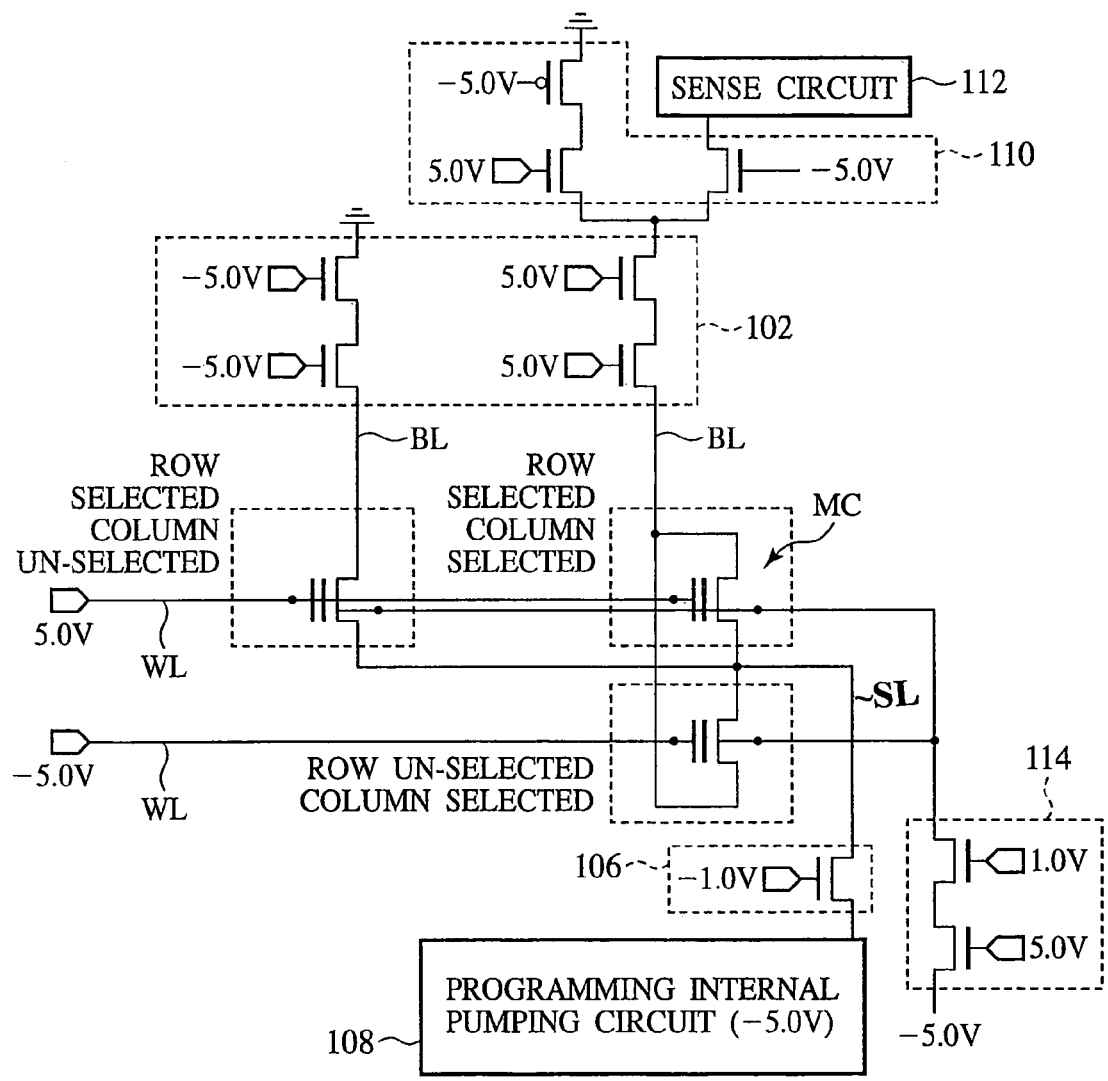
FIG. 8 is a circuit diagram showing a method for writing to the semiconductor memory device according to the third embodiment of the present invention.

In the ordinary programming, as shown in FIG. 8, a voltage of, e.g., 5 V is applied to the selected word line (word line $WL_m$), and a voltage of, e.g., −5 V is applied to the un-selected word lines (word line $WL_{m+1}$). The applied voltages to the other terminals are the same as in the method for writing to the semiconductor memory device according to the first embodiment.

As described above, according to the present embodiment, the ordinary programming is executed by connecting the internal pumping circuit which supplies a negative voltage to the source line side of the n-channel memory cell transistor and applying prescribed voltages to the other terminals with the voltage of the source as the standard, whereby the increase of the potentials of the source upon the programming can be suppressed. This makes it possible to decrease the leakage current flowing in the bit line, and to reduce the area of the pumping capacitor of the internal pumping circuit small. Thus, the chip area of the semiconductor memory device can be reduced, and the electrical power consumption for executing the programming can be decreased.

In a case that even with the source line SL made common, the writing in the un-selected memory cell transistors MC has no trouble, the source line SL is made common among a plurality of the bit lines BL, whereby the ordinary programming may be executed.

A Fourth Embodiment

The semiconductor memory device and the method for writing to the semiconductor memory device according to a fourth embodiment of the present invention will be explained with reference to FIGS. 9 and 10. The same members of the present embodiment as those of the semiconductor memory device and the method for writing to the semiconductor memory device according to the first to the third embodiments shown in FIGS. 1 to 8 are represented by the same reference numbers not to repeat or to simplify their explanation.

Figure 9:
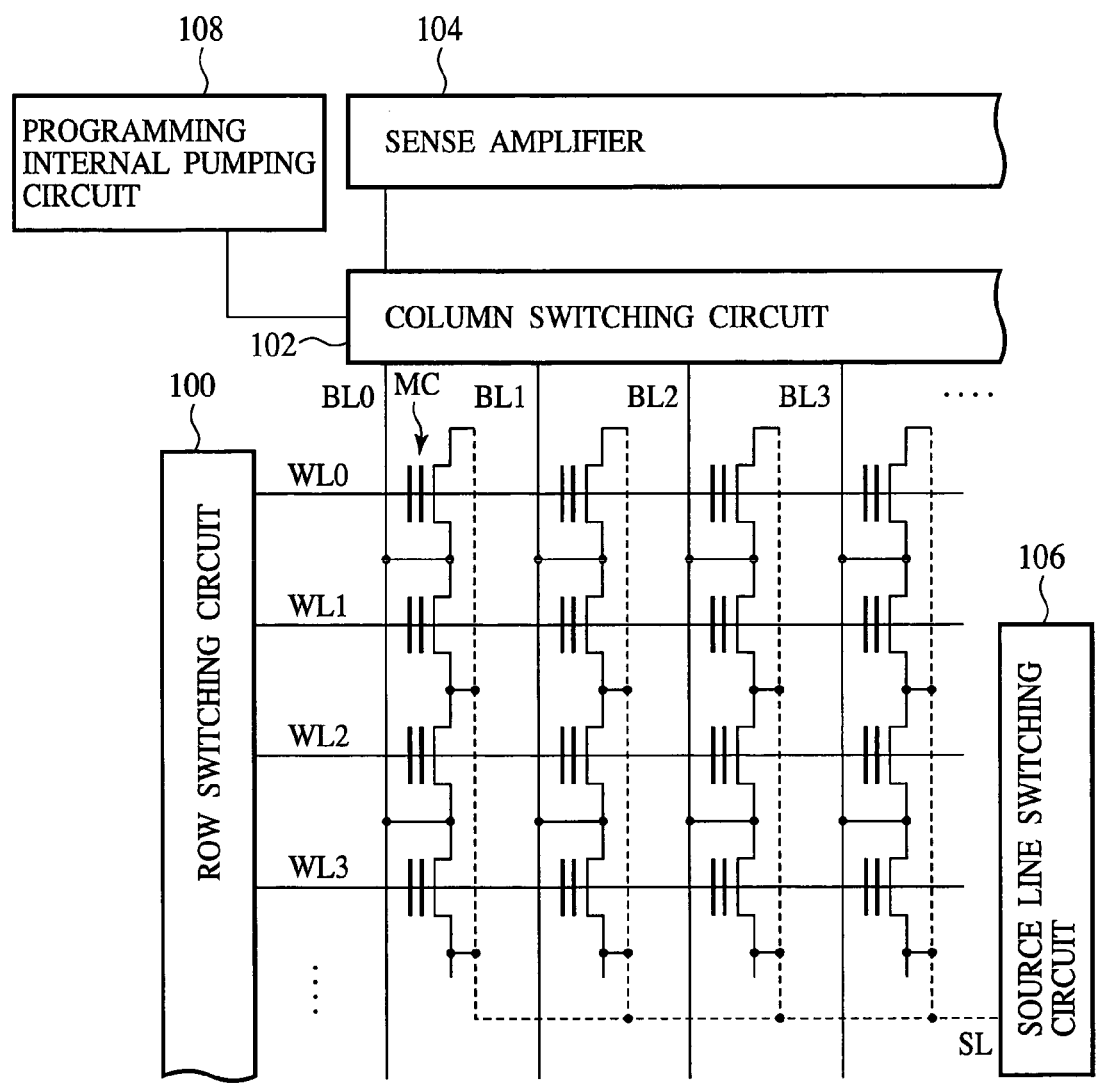
FIG. 9 is a circuit diagram of the semiconductor memory device according to a fourth embodiment of the present invention, which shows a structure thereof.

FIG. 9 is a circuit diagram showing a structure of the semiconductor memory device according to the present embodiment. FIG. 10 is a circuit diagram showing the structure of the semiconductor memory device and the method for writing to the semiconductor memory device according to the present embodiment.

First, the structure of the semiconductor memory device according to the present embodiment will be explained with reference to FIG. 9.

As shown in FIG. 9, memory cell transistors MC are arranged in a matrix in the row-wise (horizontally as viewed in the drawing) and column-wise (vertically as viewed in the drawing), and a memory cell array is formed.

Word lines WL (WL0, WL1, WL2, WL3, . . . ) extended in row-wise are provided for the respective rows of the memory cell array. The gate terminals of the memory cell transistors MC arranged in row-wise are commonly connected to the associated word lines WL.

Bit lines BL (BL0, BL1, BL2, BL3, . . . ) extended in column-wise are provided for the respective columns of the memory cell array. One terminals of the source/drain terminals (e.g., the drain terminals) of the memory cell transistors MC arranged in column-wise are commonly connected to the associated bit lines BL. The other terminals of the source/drain terminals (e.g., the source terminals) of the memory cell transistors MC are commonly connected to the source line SL.

The bit lines BL are connected to a programming internal pumping circuit 108 for increasing the power supply voltage via the column switching circuit 102. The column switching circuit 102 is connected to a sense amplifier 104. The source line SL is connected to the source line switching circuit 106. The word lines WL are connected to the row switching circuit 100 to thereby apply prescribed drive voltages to arbitrary word lines WL.

As described above, the semiconductor memory device according to the present embodiment is characterized mainly in that the programming internal pumping circuit 108 is connected to the bit lines BL via the column switching circuit 102.

In the method for writing to the semiconductor memory device according to the first to the third embodiments, in which a voltage of −5 V is applied, upon the writing, from the programming internal pumping circuit 108 connected to the source line SL, with the source line SL connected commonly to the plurality of bit lines BL, the write-back programming including the transient charge/discharge current of the un-selected bit lines BL must be executed on a large number of cells, and a larger current-supplying capacity covering also the transient charge/discharge current is required. There is an inconvenience that as explained in the third embodiment, with the source line SL made common among a large number of bit lines BL, the ordinary writing which is made in each cell cannot be made.

Then, in the semiconductor memory device according to the present embodiment, as shown in FIG. 9, the programming internal pumping circuit 108 is connected to the bit lines BL via the column switching circuit 102, and the bit lines BL are operated as the source terminals in writing. Thus, even with the source line SL made common, the current-supplying capacity required for the programming internal pumping circuit 108 can be suppressed, and the write-back programming can be made for each bit line.

Figure 10:
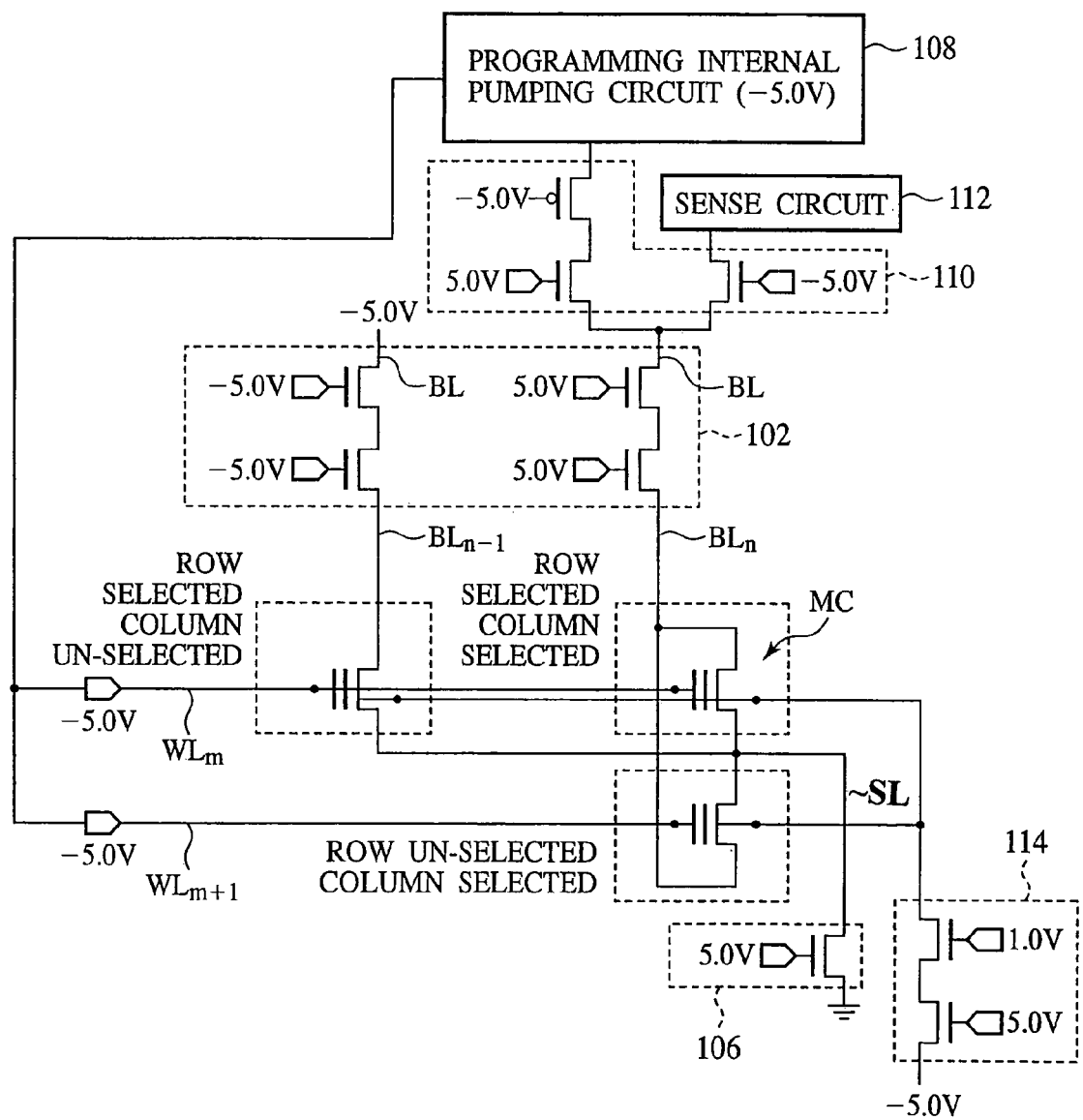
FIGS. 10 and 11 are circuit diagrams showing a method for writing to the semiconductor memory device according to the fourth embodiment of the present invention.

FIG. 10 shows a detailed circuit diagram and the applied voltages for the write-back programming.

As shown in FIG. 10, a voltage of, e.g., −5 V supplied from the programming internal pumping circuit 108 is applied to the selected bit line (bit line $BL_n$) via the column switching circuit 102 and a programming/reading conversion switch 110.

A drive voltage of, e.g., −5 V is applied to the switching transistors of the un-selected bit lines (bit line $BL_{n-1}$), and the un-selected bit lines are floating, because the switching transistor is off state. The un-selected bit lines BL may be connected to the reference voltage via the column switching circuit 102, etc. In this case, the potential of the un-selected bit lines only becomes the same as the potential of the source line SL, and neither DC current nor charge/discharge current flows.

A voltage of, e.g., −5 V voltage supplied from the programming internal pumping circuit 108 is applied to both of the selected word line (word line $WL_m$) and the un-selected word lines (word line $WL_{m+1}$) via the row switching circuit (not shown). The word lines WL may be connected to a power supply which is different from the programming internal pumping circuit 108.

The source line SL is connected to, e.g., a reference voltage via a source line switching circuit 106.

A voltage of, e.g., −5 V is applied, via a p-well switching circuit 114, to the p-well where the memory cell transistors MC are formed. The p-well is connected to a power supply which is different from the programming internal pumping circuit 108 connected to the bit line $BL_n$.

The write-back programming is thus executed, whereby even with the source line SL made common, the current-supplying capacity required of the programming internal pumping circuit can be suppressed, and the write-back programming can be made for each bit line.

Figure 11:
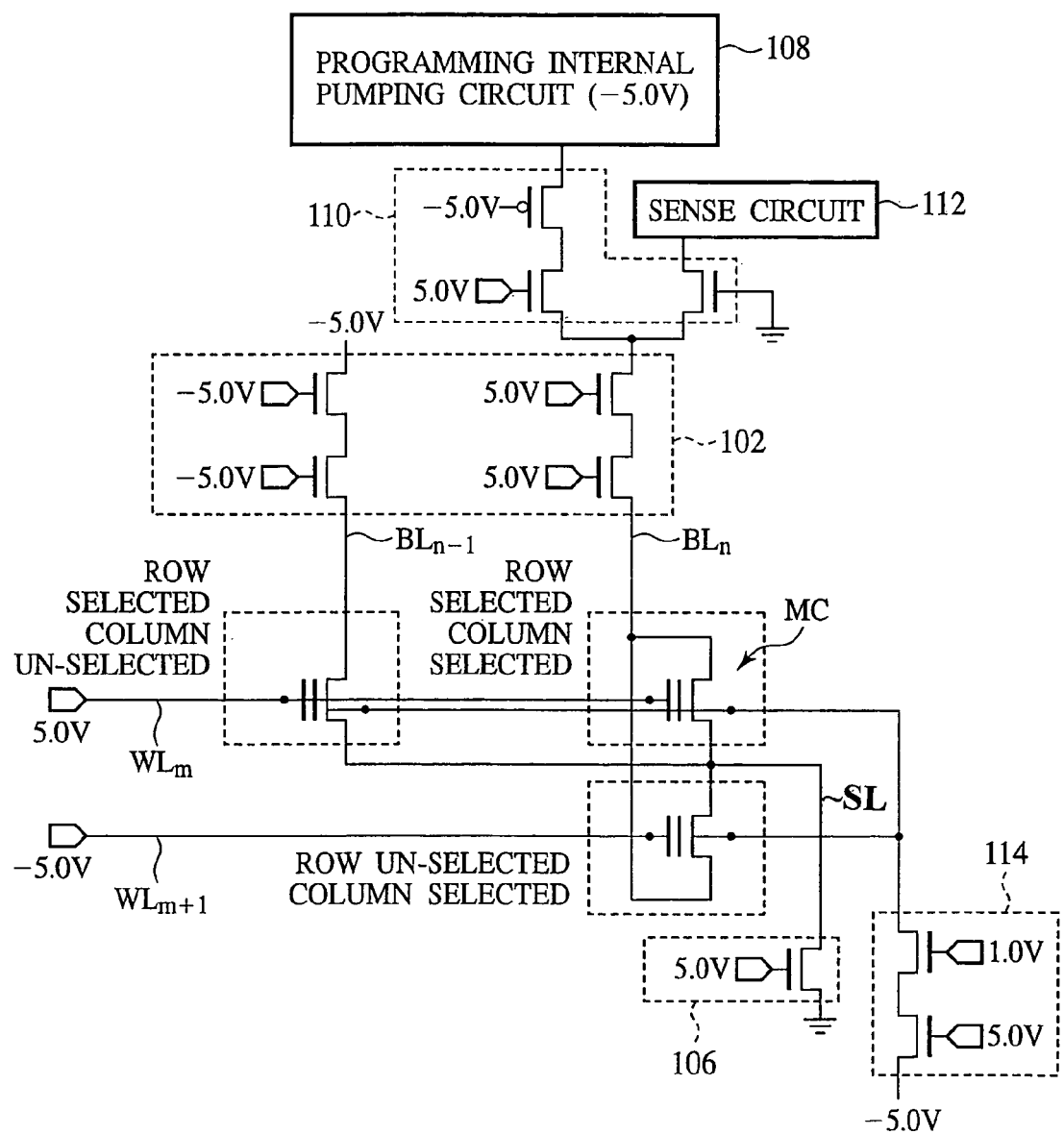

FIG. 11 shows the detailed circuit diagram and the applied voltages for executing the ordinary programming.

As shown in FIG. 11, a voltage of, e.g., −5 V supplied from the programming internal pumping circuit 108 is applied to the selected bit line (bit line $BL_n$) via the column switching circuit 102 and the programming/reading conversion switch 110.

A drive voltage of, e.g., −5 V is applied to the switching transistors of the un-selected bit lines (bit line $BL_{n-1}$), and the un-selected bit lines are floating. The un-selected bit lines BL may be connected to a reference voltage via the column switching circuit 102, etc. In this case, the potential of the un-selected bit lines only becomes the same as the potential of the source line SL, and neither DC current nor charge/discharge current flows.

A voltage of, e.g., 5 V is applied to the selected word line (word line WLm) via the row switching circuit (not shown). A voltage of, e.g., −5 V is applied to the un-selected word lines (word line $WL_{m+1}$) via the row switching circuit (not shown).

The source line SL is connected to, e.g., the reference voltage via the source line switching circuit 106.

A voltage of, e.g., −5 V is applied, via a p-well switching circuit 114, to the p-well where the memory cell transistors MC are formed. The p-well is connected to a power supply which is different from the programming internal pumping circuit 108 connected to the bit lines BL.

The ordinary programming is thus executed, whereby even with the source line SL made common, the current-supplying capacity required for the programming internal pumping circuit can be suppressed compared to the first to the third embodiments, and the programming can be made for each memory cell.

Read operation for this embodiment is done the same way as usual.

Figure 12:
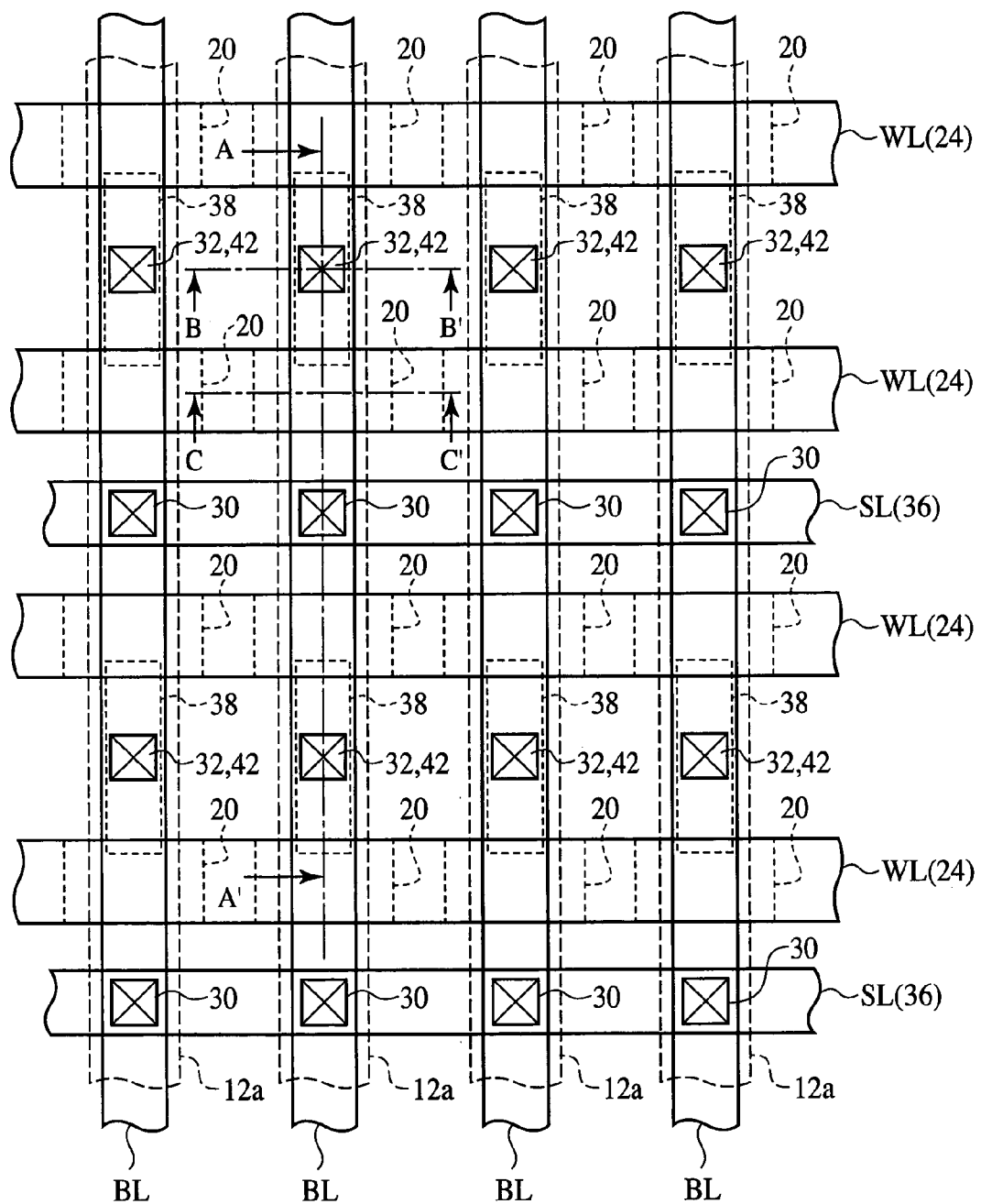
FIG. 12 is a plan view of the semiconductor memory device according to the fourth embodiment of the present invention, which shows the structure thereof.
Figure 13C:
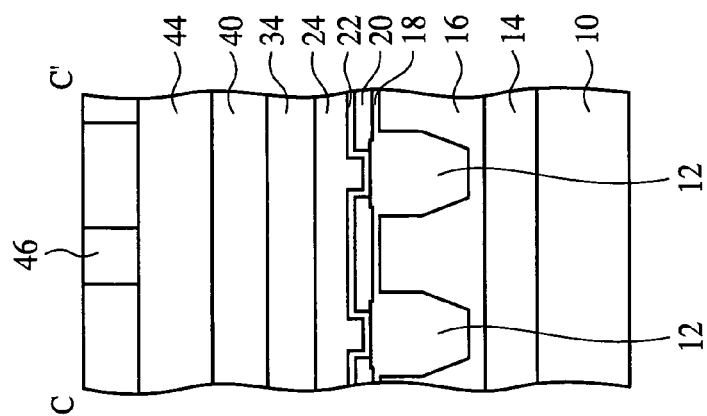
FIGS. 13A-13C are a diagrammatic sectional views of the semiconductor memory device according to the fourth embodiment of the present invention, which shows the structure thereof.
Figure 13B:
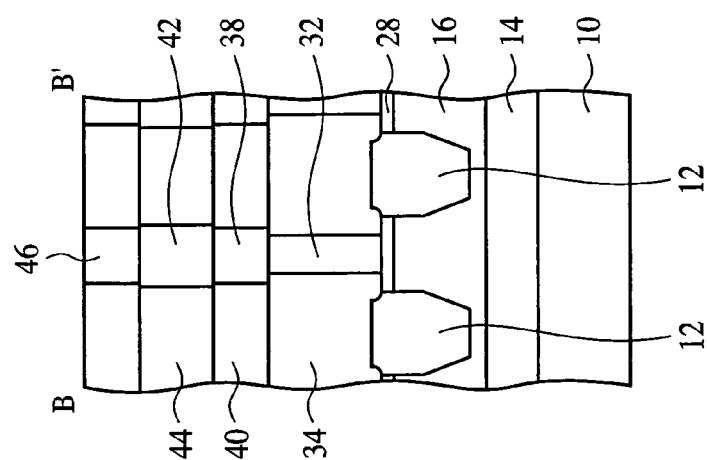
Figure 13A:
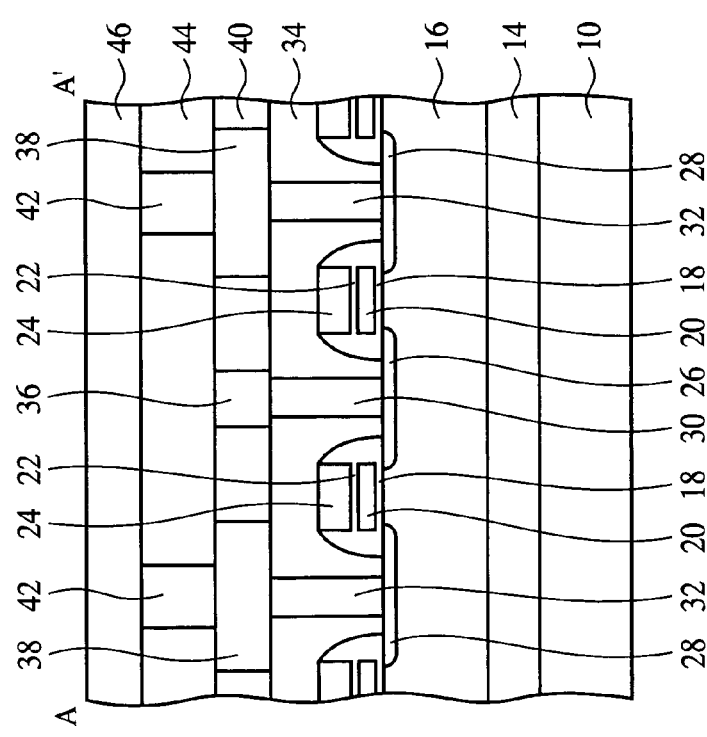
Figure 14A:
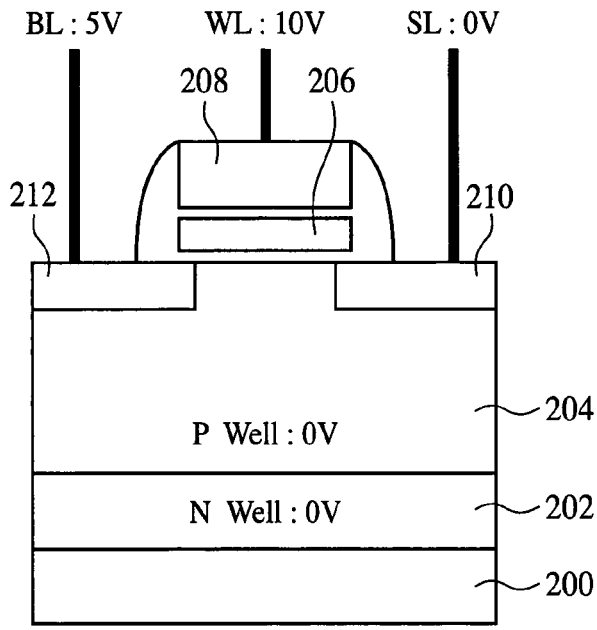
FIGS. 14A is a diagrammatic sectional view showing the method for writing to the conventional semiconductor memory device.
Figure 14B:
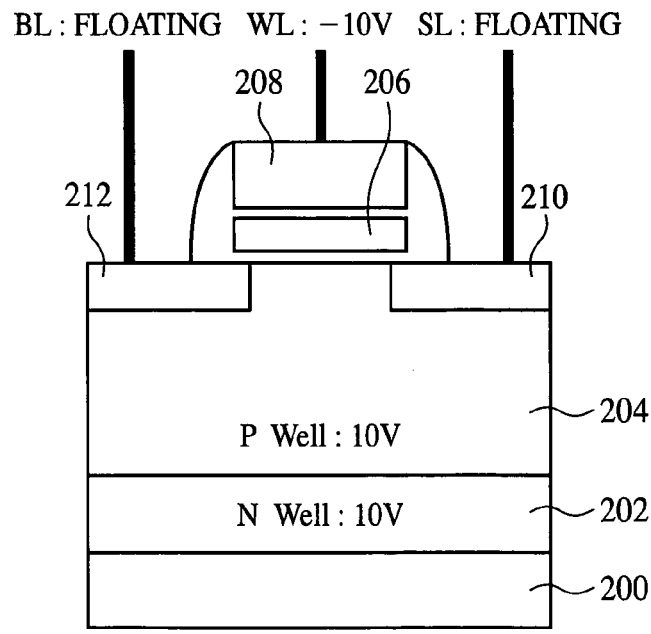
FIGS. 14B is a diagrammatic sectional view showing the method for erasing the conventional semiconductor memory device.

Next, one example of specific structures of the semiconductor memory device suitable for the method for writing to the semiconductor memory device according to the present embodiment will be explained with reference to FIGS. 12 to 13C. FIG. 12 is a plan view showing the structure of the semiconductor memory device according to the present embodiment. FIGS. 13A-13C are diagrammatic sectional views showing the structure of the semiconductor memory device according to the present embodiment. FIG. 13A is the sectional view along the line A-A' in FIG. 12, FIG. 13B is the sectional view along the line B-B' in FIG. 12, and FIG. 13C is the sectional view along the line C-C' in FIG. 12.

In a p-type silicon substrate 10, a device isolation film 12 defining active regions 12a, an n-well 14, and a p-well formed in the n-well 14 are formed. The p-well 16 is electrically isolated from the p-type silicon substrate 10 by the n-well 14.

On the active regions 12a, memory cell transistors each including a floating gate 20 formed over the p-type silicon substrate 10 with a tunnel insulating film 18 interposed therebetween, a control gate 24 formed over the floating gate 20 with an ONO film 22 interposed therebetween, and a pair of source/drain regions 26, 28 formed in the p-type silicon substrate 10 on both sides of the control gate 24 are formed. The control gates 24 of the memory cell transistors arranged in row-wise (horizontally as viewed in the drawing) are connected commonly to word lines WL.

Over the p-type silicon substrate 10 with the memory cell transistors formed on, an inter-layer insulating film 34 with a contact plug 30 connected to the source/drain region 26 and a contact plug 32 connected to the source/drain region 28 buried in is formed.

On the inter-layer insulating film 34 with the contact plugs 30, 32 buried in, an inter-layer insulation film 40 with source lines 36 (SL) electrically connected to the source/drain regions 26 via the contact plugs 30 and interconnections 38 electrically connected to the source/drain regions 28 via contact plugs 32 buried in is formed.

On the inter-layer insulation film 40 with the source lines 36 and the interconnections 38 buried in, an inter-layer insulating film 44 with contact plugs 42 connected to the interconnections 38 buried in is formed.

On the inter-layer insulation film 44, bit lines 46 (BL) electrically connected to the source/drain regions 28 via the contact plugs 42, the interconnections 38 and the contact plugs 32 are formed.

In the semiconductor memory device shown in FIGS. 12 to and 13C, the source/drain regions 26, 28, etc. are structured symmetrical so that the use of either of the source line SL side and the bit line BL side as the drain produces equivalent characteristics. Thus, even when the bit line BL side is used as the drain in the ordinary programming or reading, and the source line SL side is used as the drain in the write-back programming, equivalent programming and reading characteristics can be produced. Accordingly, no special design contrivance is required, which can simplify the circuit structure.

As described above, according to the present embodiment, the programming is executed by connecting the internal pumping circuit which supplies a negative voltage to the bit line side of the n-channel memory cell transistor and is used as a source terminal, and applying prescribed voltages to the other terminals as the standard, whereby the increase of the potentials of the source upon the programming can be suppressed. This makes it possible to decrease the leakage current flowing in the bit line, and to reduce the area of the pumping capacitor of the internal pumping circuit small. Thus, the chip area of the semiconductor memory device can be reduced, and the electrical power consumption for executing the programming can be decreased.

The terminal of the bit line side is used as the source terminal, whereby the leakage current flowing in the bit lines which are not selected upon the writing can be decreased. Thus, the area of the pumping capacitor of the internal pumping circuit can be reduced, and the electric power consumption upon the writing can be decreased.

Modified Embodiments

The present invention is not limited to the above-described embodiments and can cover other various modifications.

For example, the present invention is applied to a nonvolatile semiconductor memory device including floating gates as the charge storage layer. However, the present invention is also applicable to a nonvolatile semiconductor memory device including as the charge storage layer a silicon oxide film/a silicon nitride film/a silicon oxide film (ONO film) or a silicon oxide film/an alumina film/a silicon oxide film to store charges in the charge storage layer.

In the above-described embodiments, the semiconductor memory device includes n-channel memory cell transistors. The present invention is also applicable similarly to the semiconductor memory device including the p-channel memory cell transistors, and in this case, the internal pumping circuit, which supplies positive voltages, is connected to the source side. The conductivity type of the wells and the polarities of the other applied voltages are respectively reversed.

In the present invention, a voltage supplied from the internal pumping circuit is applied to the terminal of the memory cell transistor used as the source, and with this voltage as the standard, the prescribed voltages necessary to writing are applied to the respective terminals. The applied voltages to the respective terminals are not limited to the values described in the above-described embodiments. Preferably, the applied voltages to be applied to the respective terminals for writing are determined suitably in accordance with structures, generations, etc. of semiconductor memory devices.

What is claimed is:

1. A semiconductor memory device comprising:
   an n-channel memory cell transistor including: a first diffused region and a second diffused region formed in a semiconductor substrate; a charge storage layer formed over the semiconductor substrate between the first diffused region and the second diffused region; and a gate electrode formed over the charge storage layer;
   a power supply circuit formed on the semiconductor substrate and connected to the first diffused region, the power supply circuit, pumping a voltage supplied from an outside power supply and outputting the pumped voltage; and
   writing means which, upon writing to the n-channel memory cell transistor, applies a ground voltage to the second diffused region, and applies a negative voltage supplied from the power supply circuit to the first diffused region to thereby flow current between the first diffused region and the second diffused region and to store charges in the charge storage layer.

2. The semiconductor memory device according to claim 1, wherein
   the power supply circuit is connected to the gate electrode.

3. The semiconductor memory device according to claim 1, wherein
   the first diffused region is connected to the power supply circuit via a bit line, and
   the second diffused region is connected to the ground voltage via a source line.

4. The semiconductor memory device according to claim 1, wherein,
   the first diffused region is connected to the power supply circuit via a source line, and
   the second diffused region is connected to the ground voltage via a bit line.

5. A method for writing to a semiconductor memory device comprising an n-channel memory cell transistor including a first diffused region and a second diffused region formed in a semiconductor substrate, a charge storage layer formed over the semiconductor substrate between the first diffused region and the second diffused region, and a gate electrode formed over the charge storage layer; and a power supply circuit formed on the semiconductor substrate, the power supply circuit being connected to the first diffused region, pumping a voltage supplied from an outside power supply and outputting the pumped voltage, comprising:
   applying a ground voltage to the second diffused region, supplying a negative voltage from the power supply circuit, and applying the negative voltage to the first diffused region, whereby current is flowed between the first diffused region and the second diffused region, and charges are stored in the charge storage layer.

6. The method for writing to a semiconductor memory device according to claim 5, wherein
   a negative voltage is applied to the gate electrode to thereby execute a write-back programming in the n-channel memory cell transistor.

7. The method for writing to a semiconductor memory device according to claim 6, wherein
   the negative voltage supplied from the power supply circuit is applied to the gate electrode.

8. The method for writing to a semiconductor memory device according to claim 5, wherein
   a positive voltage is applied to the gate electrode to thereby write a memory information in the n-channel memory cell transistor.

9. The method for writing to a semiconductor memory device according to claim 5, wherein
   the negative voltage is applied to the first diffused region via a bit line, and
   the ground voltage is applied to the second diffused region via a source line.

10. The method for writing to the semiconductor memory device according to claim 5, wherein
    the negative voltage is applied to the first diffused region via a source line, and
    the ground voltage is applied to the second diffused region via a bit line.

11. The method for writing to a semiconductor memory device according to claim 5, wherein
    the n-channel memory cell transistor is formed in a p-well formed in an n-well formed in the semiconductor substrate, and
    a negative voltage supplied from another power supply circuit which is different from said the power supply circuit is applied to the p-well.

12. A semiconductor memory device comprising:
    a p-channel memory cell transistor including: a first diffused region and a second diffused region formed in a semiconductor substrate; a charge storage layer formed over the semiconductor substrate between the first diffused region and the second diffused region; and a gate electrode formed over the charge storage layer;
    a power supply circuit formed on the semiconductor substrate and connected to the first diffused region, the power supply circuit pumping a voltage supplied from an outside power supply and outputting the pumped voltage; and
    writing means which, upon writing to the p-channel memory cell transistor, applies a ground voltage to the second diffused region, and applies a positive voltage supplied from the power supply circuit to the first diffused region to thereby flow current between the first diffused region and the second diffused region and to store charges in the charge storage layer.

13. The semiconductor memory device according to claim 12, wherein the power supply circuit is connected to the gate electrode.

14. The semiconductor memory device according to claim 12, wherein the first diffused region is connected to the power supply circuit via a bit line, and the second diffused region is connected to the ground voltage via a source line.

15. The semiconductor memory device according to claim 12, wherein,
the first diffused region is connected to the power supply circuit via a source line, and
the second diffused region is connected to the ground voltage via a bit line.

16. A method for writing to a semiconductor memory device comprising a p-channel memory cell transistor including a first diffused region and a second diffused region formed in a semiconductor substrate, a charge storage layer formed over the semiconductor substrate between the first diffused region and the second diffused region, and a gate electrode formed over the charge storage layer; and a power supply circuit formed on the semiconductor substrate, the power supply circuit being connected to the first diffused region, pumping a voltage supplied from an outside power supply and outputting the pumped voltage, comprising:
applying a ground voltage to the second diffused region, supplying a positive voltage from the power supply circuit, and applying the positive voltage to the first diffused region, whereby current is flowed between the first diffused region and the second diffused region, and charges are stored in the charge storage layer.

17. The method for writing to a semiconductor memory device according to claim 16, wherein
a positive voltage is applied to the gate electrode to thereby execute a write-back programming in the p-channel memory cell transistor.

18. The method for writing to a semiconductor memory device according to claim 17, wherein
the positive voltage supplied from the power supply circuit is applied to the gate electrode.

19. The method for writing to a semiconductor memory device according to claim 16, wherein
the positive voltage is applied to the first diffused region via a bit line, and the ground voltage is applied to the second diffused region via a source line.

20. The method for writing to the semiconductor memory device according to claim 16, wherein
the positive voltage is applied to the first diffused region via a source line, and
the ground voltage is applied to the second diffused region via a bit line.

21. The method for writing to a semiconductor memory device according to claim 16, wherein
the p-channel memory cell transistor is formed in a n-well formed in an p-well formed in the semiconductor substrate, and
a positive voltage supplied from another power supply circuit which is different from said the power supply circuit is applied to the n-well.

22. The method for writing to a semiconductor memory device according to claim 16, wherein
a negative voltage is applied to the gate electrode to thereby write a memory information in the p-channel memory cell transistor.

* * * * *